United States Patent
Inoue et al.

(10) Patent No.: US 12,139,406 B2
(45) Date of Patent: Nov. 12, 2024

(54) METHOD FOR PRODUCING SUBSTANCE WITH MODIFIED CARBON ALLOTROPE SURFACE, METHOD FOR PRODUCING SUBSTANCE WITH CARBON ALLOTROPE SURFACE INTO WHICH FUNCTIONAL GROUP IS INTRODUCED, METHOD FOR PRODUCING GRID FOR CRYO-ELECTRON MICROSCOPY, ORGANIC SUBSTANCE, AND GRID FOR CRYO-ELECTRON MICROSCOPY

(71) Applicant: OSAKA UNIVERSITY, Suita (JP)

(72) Inventors: Tsuyoshi Inoue, Osaka (JP); Haruyasu Asahara, Osaka (JP); Kei Ohkubo, Osaka (JP); Kenji Iwasaki, Osaka (JP); Naoyuki Miyazaki, Osaka (JP); Mika Hirose, Osaka (JP); Atsushi Nakagawa, Osaka (JP); Junichi Takagi, Osaka (JP); Takefumi Doi, Osaka (JP); Hiroaki Adachi, Osaka (JP)

(73) Assignee: Osaka University, Osaka (JP)

( * ) Notice: Subject to any disclaimer, the term of this patent is extended or adjusted under 35 U.S.C. 154(b) by 344 days.

(21) Appl. No.: 17/441,971

(22) PCT Filed: Mar. 27, 2020

(86) PCT No.: PCT/JP2020/014148
§ 371 (c)(1),
(2) Date: Sep. 22, 2021

(87) PCT Pub. No.: WO2020/196858
PCT Pub. Date: Oct. 1, 2020

(65) Prior Publication Data
US 2022/0204346 A1 Jun. 30, 2022

(30) Foreign Application Priority Data
Mar. 27, 2019 (JP) .............................. 2019-061938

(51) Int. Cl.
*C01B 32/156* (2017.01)
*C01B 32/05* (2017.01)
(Continued)

(52) U.S. Cl.
CPC ............ *C01B 32/156* (2017.08); *C01B 32/05* (2017.08); *C01B 32/168* (2017.08); *C01B 32/194* (2017.08); *H01J 37/20* (2013.01)

(58) Field of Classification Search
CPC ..... C01B 32/156; C01B 32/05; C01B 32/168; C01B 32/194; C01B 32/15; C01B 11/022; H01J 37/20; H01J 37/26
(Continued)

(56) References Cited

U.S. PATENT DOCUMENTS 11,525,760 B2 * 12/2022 Coon ..................... G01N 1/36
11,643,328 B2 * 5/2023 Kawakami ........... C01B 32/159
423/415.1
(Continued)

FOREIGN PATENT DOCUMENTS

CN 102194633 9/2011
CN 103025654 4/2013
(Continued)

OTHER PUBLICATIONS

International Search Report issued in International Application No. PCT/JP2020/014148, Jun. 23, 2020, 6 pages w/translation.
(Continued)

*Primary Examiner* — Kiet T Nguyen
(74) *Attorney, Agent, or Firm* — HSML P.C.

(57) ABSTRACT

The present invention provides a method for producing a substance with a modified carbon allotrope surface that can
(Continued)

suppress or prevent uneven distribution, uneven orientation, and the like of a structural analysis target substance in a structural analysis by cryo-electron microscopy. A method for producing a substance with a modified carbon allotrope surface of the present invention includes: the step of surface-treating by reacting a carbon allotrope surface with a halogen oxide radical, wherein the carbon allotrope surface is modified by the surface-treating.

9 Claims, 11 Drawing Sheets

(51) Int. Cl.
  *C01B 32/168* (2017.01)
  *C01B 32/194* (2017.01)
  *H01J 37/20* (2006.01)
(58) Field of Classification Search
  USPC .................................................. 250/440.11
  See application file for complete search history.

(56) References Cited

U.S. PATENT DOCUMENTS

| | | | |
|---|---|---|---|
| 11,728,146 B2* | 8/2023 | Westphall | H01J 49/0486 250/282 |
| 2007/0207321 A1 | 9/2007 | Abe et al. | |
| 2009/0048386 A1 | 2/2009 | Plee | |
| 2011/0226413 A1 | 9/2011 | Zhang et al. | |
| 2011/0226960 A1 | 9/2011 | Zhang et al. | |
| 2012/0052301 A1 | 3/2012 | Linder | |
| 2012/0330044 A1 | 12/2012 | Hou | |
| 2013/0181165 A1 | 7/2013 | Tetsuka et al. | |
| 2013/0277573 A1* | 10/2013 | Miller | H01J 37/26 427/595 |
| 2015/0218002 A1 | 8/2015 | Plomb et al. | |
| 2016/0203942 A1 | 7/2016 | Russo et al. | |
| 2018/0019462 A1 | 1/2018 | Kadoma et al. | |
| 2018/0369798 A1 | 12/2018 | Takamori et al. | |
| 2019/0003999 A1 | 1/2019 | Thompson et al. | |
| 2019/0292444 A1 | 9/2019 | Sun et al. | |
| 2020/0165503 A1 | 5/2020 | Borini et al. | |
| 2020/0377453 A1 | 12/2020 | Takamori et al. | |
| 2020/0385516 A1 | 12/2020 | Nakasuga et al. | |
| 2023/0324666 A1* | 10/2023 | Inoue | C01B 32/194 |

FOREIGN PATENT DOCUMENTS

| | | |
|---|---|---|
| CN | 108602740 | 9/2018 |
| CN | 111477265 | 7/2020 |
| JP | 2003-505332 | 2/2003 |
| JP | 2005-250721 | 9/2005 |
| JP | 2007-055863 | 3/2007 |
| JP | 2008-529952 | 8/2008 |
| JP | 2008-230880 | 10/2008 |
| JP | 2010-005428 | 1/2010 |
| JP | 2010-535148 | 11/2010 |
| JP | 2011-198750 | 10/2011 |
| JP | 2012-136566 | 7/2012 |
| JP | 2012-518595 | 8/2012 |
| JP | 2013-006732 | 1/2013 |
| JP | 2013-056805 | 3/2013 |
| JP | 2015-147723 | 8/2015 |
| JP | 2016-532267 | 10/2016 |
| JP | 2016-534508 | 11/2016 |
| JP | 2017-092210 | 5/2017 |
| JP | 2017-109913 | 6/2017 |
| JP | 2018-016539 | 2/2018 |
| WO | 01/07694 | 2/2001 |
| WO | 2009/018204 | 2/2009 |
| WO | 2015/022510 | 2/2015 |
| WO | 2018/016616 | 1/2018 |
| WO | 2018/088494 | 5/2018 |
| WO | 2019/155989 | 8/2019 |

OTHER PUBLICATIONS

International Search Report issued in related International Application No. PCT/JP2022/037220, Dec. 13, 2022, 7 pages.
Office Action issued in corresponding Japanese Patent Application No. 2021-509654, Jan. 30, 2024, 11 pages w/translation.
Office Action issued in Chinese Patent Application No. 202080022919.4, Jul. 29, 2023, 23 pages w/translation.
Office Action issued in Chinese Patent Application No. 202180050861.9 dated Mar. 16, 2024, 17 pages w/translation.
Office Action issued in Chinese Patent Application No. 202080022919.4 dated Apr. 4, 2024, 26 pages w/translation.
Han et al., "High-yield monolayer graphene grids for near-atomic resolution cryoelectron microscopy", PNAS, vol. 117, No. 2, pp. 1009-1014 (2020).
Extended European Search Report for the related European Patent Application No. 21858394.6, Jun. 12, 2024, 9 pages.
Decision of Rejection issued in corresponding Chinese Patent Application No. 202080022919.4, Jun. 27, 2024, 22 pages w/translation.

* cited by examiner

METHOD FOR PRODUCING SUBSTANCE WITH MODIFIED CARBON ALLOTROPE SURFACE, METHOD FOR PRODUCING SUBSTANCE WITH CARBON ALLOTROPE SURFACE INTO WHICH FUNCTIONAL GROUP IS INTRODUCED, METHOD FOR PRODUCING GRID FOR CRYO-ELECTRON MICROSCOPY, ORGANIC SUBSTANCE, AND GRID FOR CRYO-ELECTRON MICROSCOPY

TECHNICAL FIELD

The present invention relates to a method for producing a substance with a modified carbon allotrope surface, a method for producing a substance with a carbon allotrope surface into which a functional group is introduced, a method for producing a grid for cryo-electron microscopy, an organic substance, and a grid for cryo-electron microscopy.

BACKGROUND ART

Cryo-electron microscopy is used for a structural analysis of substances such as proteins (Patent Literature 1, etc.).

For the structural analysis of a structural analysis target substance (e.g., a protein) to be analyzed by cryo-electron microscopy, a carbon grid formed of graphene or diamond-like carbon (DLC) is used to capture the structural analysis target substance.

CITATION LIST

Patent Literature

Patent Literature 1: JP 2005-250721 A

SUMMARY OF INVENTION

Technical Problem

However, when a structural analysis target substance such as a protein is captured by a carbon grid, uneven distribution (localization), uneven orientation, and the like of the structural analysis target substance occur on the carbon grid, which may hinder the structural analysis.

With the foregoing in mind, it is an object of the present invention to provide a method for producing a substance with a modified carbon allotrope surface, a method for producing a substance with a carbon allotrope surface into which a functional group is introduced, a method for producing a grid for cryo-electron microscopy, an organic substance, and a grid for cryo-electron microscopy that can suppress or prevent uneven distribution, uneven orientation, and the like of a structural analysis target substance in a structural analysis by cryo-electron microscopy.

Solution to Problem

In order to achieve the above object, the present invention provides a method for producing a substance with a modified carbon allotrope surface, including: the step of surface-treating by reacting a carbon allotrope surface with a halogen oxide radical, wherein the carbon allotrope surface is modified by the surface-treating.

The present invention also provides a method for producing a substance with a carbon allotrope surface into which a functional group is introduced, including the steps of: producing a substance with a modified carbon allotrope surface by the method for producing a substance with a modified carbon allotrope surface of the present invention; and introducing a functional group into the modified surface.

The present invention also provides a method for producing a grid for cryo-electron microscopy formed of a substance with a carbon allotrope surface into which a functional group is introduced, including the step of: producing a substance with a carbon allotrope surface into which a functional group is introduced by the method for producing a substance with a carbon allotrope surface into which a functional group is introduced of the present invention.

The present invention also provides a first organic substance with a carbon allotrope surface into which at least one substituent selected from the group consisting of a hydroxy group, a carboxy group, and an aldehyde group is introduced, and further the substituent is converted into another functional group.

The present invention also provides a second organic substance with a diamond-like carbon (DLC) surface into which a functional group is introduced. In the following description, the first organic substance of the present invention and the second organic substance of the present invention may be collectively referred to as "the organic substance of the present invention".

The present invention also provides a grid for cryo-electron microscopy formed of the organic substance of the present invention.

Advantageous Effects of Invention

The present invention can provide a method for producing a substance with a modified carbon allotrope surface, a method for producing a substance with a carbon allotrope surface into which a functional group is introduced, a method for producing a grid for cryo-electron microscopy, an organic substance, and a grid for cryo-electron microscopy that can suppress or prevent uneven distribution, uneven orientation, and the like of a structural analysis target substance in a structural analysis by cryo-electron microscopy.

DESCRIPTION OF EMBODIMENTS

Figure 1:
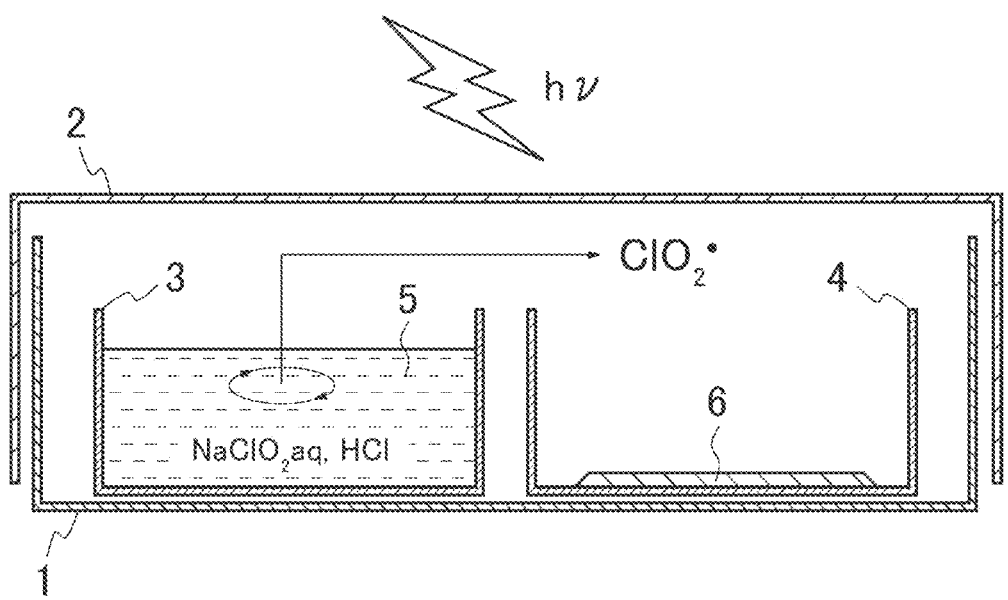
FIG. 1 is a diagram schematically showing an example of a device for performing the surface-treating using a reaction in a gas phase.

The present invention will be described below in more detail with reference to illustrative examples. The present invention, however, is not limited by the following description.

In the method for producing a substance with a modified carbon allotrope surface of the present invention, for example, the carbon allotrope may be diamond-like carbon (DLC), graphene, carbon nanotube, fullerene, nanodiamond, graphite, diamond, carbon nanohorn, or carbon fiber.

In the method for producing a substance with a modified carbon allotrope surface of the present invention, for example, the carbon allotrope surface may be oxidized by the surface-treating, and the substance with a modified carbon allotrope surface may be a substance with an oxidized carbon allotrope surface.

In the method for producing a substance with a modified carbon allotrope surface of the present invention, for example, the reaction system may not be irradiated with light in the surface-treating.

In the method for producing a substance with a modified carbon allotrope surface of the present invention, for example, the reaction system of the surface-treating may be a gas reaction system or a liquid reaction system.

In the method for producing a substance with a modified carbon allotrope surface of the present invention, for example, the halogen oxide radical may be a chlorine dioxide radical.

In the method for producing a substance with a carbon allotrope surface into which a functional group is introduced of the present invention, for example, the functional group may be at least one selected from the group consisting of a hydroxy group, a carboxy group, an aldehyde group (formyl group), a carbonyl group, an ether bond, and an ester bond.

In the first organic substance of the present invention, for example, the carbon allotrope may be diamond-like carbon (DLC), graphene, carbon nanotube, fullerene, nanodiamond, graphite, diamond, or carbon fiber.

In the organic substance of the present invention, for example, the functional group may be at least one selected from the group consisting of a hydroxy group, a carboxy group, an aldehyde group, a carbonyl group, an ether bond, and an ester bond.

The grid for cryo-electron microscopy of the present invention may be a grid for cryo-electron microscopy to which a structural analysis target substance to be analyzed by cryo-electron microscopy is further bonded.

The grid for cryo-electron microscopy of the present invention can be used in a structural analysis method for a structural analysis target substance using cryo-electron microscopy. The specific usage of the grid for cryo-electron microscopy is not particularly limited, and may be, for example, the same as that of a general grid for cryo-electron microscopy. The structural analysis target substance is not particularly limited and may be, for example, at least one selected from the group consisting of a protein, an antibody, a nucleic acid, a virus, a ribosome, a mitochondrion, an ion channel, an enzyme, and an enzyme complex.

In the present invention, the carbon allotrope surface can be modified by the surface-treating. Herein, the surface-treating may also be referred to as a "modification treatment" or a "modification method". When oxidizing the carbon allotrope by the surface-treating, it can be said that the surface-treating is a method for oxidizing the carbon allotrope.

In the present invention, the salt is not particularly limited, and may be, for example, an acid addition salt or a base addition salt. An acid that forms the acid addition salt may be either an inorganic acid or an organic acid, and a base that forms the base addition salt may be either an inorganic base or an organic base. The inorganic acid is not particularly limited, and examples thereof include sulfuric acid, phosphoric acid, hydrofluoric acid, hydrochloric acid, hydrobromic acid, hydroiodic acid, hypofluorous acid, hypochlorous acid, hypobromous acid, hypoiodous acid, fluorous acid, chlorous acid, bromous acid, iodous acid, fluorine acid, chloric acid, bromic acid, iodic acid, perfluoric acid, perchloric acid, perbromic acid, and periodic acid. The organic acid also is not particularly limited, and examples thereof include p-toluenesulfonic acid, methanesulfonic acid, oxalic acid, p-bromobenzenesulfonic acid, carbonic acid, succinic acid, citric acid, benzoic acid, and acetic acid. The inorganic base is not particularly limited, and examples thereof include ammonium hydroxides, alkali metal hydroxides, alkaline-earth metal hydroxides, carbonates, and hydrogencarbonates. More specifically, the inorganic base may be, for example, sodium hydroxide, potassium hydroxide, potassium carbonate, sodium carbonate, sodium hydrogencarbonate, potassium hydrogencarbonate, calcium hydroxide, or calcium carbonate. The organic base also is not particularly limited, and examples thereof include ethanolamine, triethylamine, and tris(hydroxymethyl)aminomethane.

An embodiment of the present invention will be described below in more detail with reference to illustrative examples. The present invention, however, is by no means limited thereby.

[1. Method for Producing Substance with Modified Carbon Allotrope Surface]

As described above, the method for producing a substance with a modified carbon allotrope surface of the present invention includes: the step of surface-treating by reacting a carbon allotrope surface with a halogen oxide radical, wherein the carbon allotrope surface is modified by the surface-treating.

(1) Carbon Allotrope

The carbon allotrope is not particularly limited, and may be, for example, diamond-like carbon (hereinafter, sometimes referred to as "DLC"), graphene, carbon nanotube, fullerene, nanodiamond, graphite, diamond, or carbon fiber, as described above. The carbon nanotube is not particularly limited, and may be, for example, a single-walled carbon nanotube. When used in the grid for cryo-electron microscopy to be described below, graphene or DLC is preferred, and DLC is particularly preferred.

In the present invention, the carbon allotrope may or may not include elements other than carbon. Examples of the other element include hydrogen, oxygen, nitrogen, sulfur, boron, silicon, phosphorus, and various metal elements. As to the carbon allotrope, for example, the skeleton may be formed only by a bond between carbon atoms, and the other atoms may be bonded to the surface. For example, the carbon allotrope may have groups such as a hydroxy group, a methyl group, a carboxy group, an aldehyde group, a carbonyl group, an ether bond, an ester bond, or the like on its face. When the carbon allotrope includes the other elements, the content is not particularly limited, and may be, for example, 40% or less, 20% or less, or 5% or less of the whole, for example, by the number of atoms, and may be 0.01% or more, 0.1% or more, or 1% or more of the whole, for example, by the number of atoms.

According to the surface-treating of the present invention, for example, as will be described below, a functional group such as a hydroxy group, a carboxy group, or the like can be introduced by oxidizing the carbon allotrope surface. Although this mechanism is unknown, it is presumed that, for example, a methyl group or the like of the carbon allotrope surface is oxidized and converted into a hydroxymethyl group, a carboxy group, or the like. However, this description is speculative and the present invention is not limited by this description.

(2) Halogen Oxide Radical

In the present invention, the halogen oxide radical is contained in a reaction system of the surface-treating. For example, the halogen oxide radical may be contained in the reaction system by generating in the reaction system or by adding, to the reaction system, the halogen oxide radical generated separately. How to generate the halogen oxide radical is not particularly limited. A specific example of the generation of the halogen oxide radical will be described below.

For example, as the halogen oxide radical, any one of them may be used, or two or more of them may be used in combination. The halogen oxide radical may be appropriately selected, for example, depending on the type of the carbon allotrope to be modified, the reaction conditions, and the like.

Examples of the halogen oxide radical include halogen oxide radicals such as $F_2O\cdot$ (oxygen difluoride radical), $F_2O_2\cdot$ (dioxygen difluoride radical), $ClO_2\cdot$ (chlorine dioxide radical), $BrO_2\cdot$ (bromine dioxide radical), $I_2O_5\cdot$ (iodine (V) oxide), and the like.

(3) Reaction System

The reaction system in the surface-treating contains the carbon allotrope and the halogen oxide radical. The reaction system may be, as described above, for example, either a gas reaction system or a liquid reaction system. In the surface-treating, the reaction system may or may not be irradiated with light, for example. That is, the carbon allotrope and the halogen oxide radical can be reacted with each other without irradiating the carbon allotrope with light. No irradiation of the carbon allotrope with light allows safety to be improved, and costs to be reduced, for example. For example, a halogen oxide radical may be generated by light irradiation in a radical generation reaction system which is different from the reaction system of the surface-treating so as not to irradiate the reaction system of the surface-treating with light. Note that how to generate the halogen oxide radical itself is not particularly limited as described above, and the halogen oxide radical may be generated without light irradiation.

(3A) Gas Reaction System

When the reaction system is a gas reaction system, for example, the carbon allotrope is placed in the gas reaction system containing the halogen oxide radical and irradiated with light. In the present invention, however, the surface-treating is not limited thereto. For example, the surface-treating may be performed without light irradiation as long as the carbon allotrope surface can be reacted with the halogen oxide radical. The gas reaction system is not particularly limited as long as it contains the radical, for example, and non-limiting examples of the type of the gas phase in the gas reaction system include air, nitrogen, noble gas, and oxygen.

In the present invention, for example, the halogen oxide radical may be introduced into or generated in the gas reaction system prior to or in parallel with the surface-treating. In the former case, for example, a gas containing the halogen oxide radical may be introduced into the gas phase. In the latter case, for example, as will be described below, the halogen oxide radical generated in the radical generation reaction system in a liquid phase may be introduced by transferring the halogen oxide radical to a gas phase.

As a specific example, when the halogen oxide radical is the chlorine dioxide radical, for example, the chlorine dioxide radical may be present in the gas phase by introducing a chlorine dioxide gas into the gas phase. The chlorine dioxide radical may be generated in the gas phase by an electrochemical method, for example.

(3B) Liquid Reaction System

When the reaction system is the liquid reaction system, the liquid reaction system contains an organic phase, for example. The liquid reaction system may be a one-phase reaction system containing only the organic phase, or a two-phase reaction system containing the organic phase and an aqueous phase, for example. For the one-phase reaction system containing only the organic phase, for example, as will be described below, an aqueous phase containing a source of the halogen oxide radical may be prepared separately to generate the halogen oxide radical in the aqueous phase, and the organic phase may then be mixed with the aqueous phase to dissolve (extract), in the organic phase, the halogen oxide radical generated in the aqueous phase.

(3B-1) Organic Phase

The organic phase contains the carbon allotrope placed therein, as described above, and is, for example, a phase of an organic solvent containing the halogen oxide radical and the carbon allotrope placed therein.

The organic solvent is not particularly limited. For example, only one type of the organic solvent may be used, or two or more types may be used in combination. In the present invention, examples of the organic solvent include a halogenated solvent and a fluorous solvent, as described above. When the liquid reaction system is the two-phase reaction system, the organic solvent is preferably, for example, a solvent that can form the two-phase system, i.e., a solvent that separates from an aqueous solvent constituting the aqueous phase described below, or a solvent that is poorly soluble or insoluble in the aqueous solvent.

The "halogenated solvent" refers, for example, to a solvent in which all or most of the hydrogen atoms of a hydrocarbon have been substituted with halogen. The halogenated solvent may be, for example, a solvent in which 50% or more, 60% or more, 70% or more, 80% or more, or 90% or more of the number of hydrogen atoms of the hydrocarbon is substituted with halogen. The halogenated solvent is not particularly limited, and examples thereof include methylene chloride, chloroform, carbon tetrachloride, carbon tetrabromide, and a fluorous solvent described below.

The "fluorous solvent" is one of the aforementioned halogenated solvents, and is, for example, a solvent in which all or most of the hydrogen atoms of a hydrocarbon have been substituted with fluorine atoms. The fluorous solvent may be, for example, a solvent in which 50% or more, 60% or more, 70% or more, 80% or more, or 90% or more of the number of hydrogen atoms of the hydrocarbon is substituted with fluorine atoms. In the present invention, the use of the fluorous solvent is advantageous in reducing or preventing side reactions due to the low reactivity of the fluorous solvent itself, for example. Examples of the side reactions include an oxidation reaction of the solvent, a hydrogen abstraction reaction of the solvent with the radical, halogenation (e.g., chlorination), and a reaction of a radical derived from a raw material compound and the solvent (e.g., a reaction of an ethyl radical and the solvent, when the hydrocarbon group in the side chain or at the terminal of the carbon allotrope is an ethyl group). Since the fluorous solvent is not easily miscible with water, the fluorous solvent is suitable for forming the two-phase reaction system, for example.

Examples of the fluorous solvent include solvents represented by the following chemical formulae (F1) to (F6). Among them, the fluorous solvent is, for example, preferably $CF_3(CF_2)_4CF_3$ having the following chemical formula (F1) where n=4.

(F1)

n = 4, boiling point = 60° C.
n = 5, boiling point = 82° C.
n = 6, boiling point = 104° C.
n = 7, boiling point = 125° C.

(F2)

n = 1 or 4
n = 1, boiling point = 135° C.

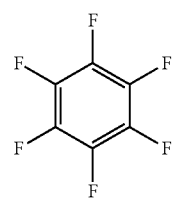

(F3)

boiling point = 81° C.

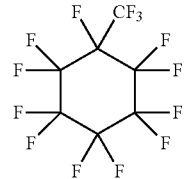

(F4)

boiling point = 76° C.

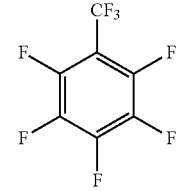

(F5)

boiling point = 104° C.

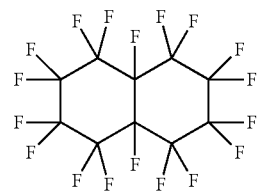

(F6)

boiling point = 142° C.

The boiling point of the organic solvent is not particularly limited. The organic solvent may be appropriately selected, for example, depending on the temperature conditions in the surface-treating. For the high reaction temperature set in the surface-treating, a high boiling point solvent may be selected as the organic solvent. Note that, for example, as will be described below, heating is not essential in the present invention, and the present invention can be implemented at ordinary temperature and normal pressure, for example. In such a case, the organic solvent need not to be, for example, a solvent having a high boiling point, and a solvent having a low boiling point can be used from the viewpoint of ease of handling.

The organic phase may contain, for example, only the carbon allotrope, the halogen oxide radical, and the organic solvent, but may further contain other components. The other component is not particularly limited, and examples thereof include Bronsted acid, Lewis acid, and oxygen ($O_2$). In the organic phase, for example, the other components may be dissolved in the organic solvent or may be undissolved. In the latter case, the other component may be dispersed or precipitated in the organic solvent, for example.

The organic phase contains the halogen oxide radical as described above. The organic phase may contain the halogen oxide radical by generating the halogen oxide radical in a phase other than the organic phase and extracting the halogen oxide radical, for example. Specifically, when the reaction system is a one-phase reaction system containing only an organic phase, for example, the halogen oxide radical is generated separately in a phase other than the organic phase being the reaction system, the generated halogen oxide radical is extracted with the organic phase, and the organic phase containing the extracted halogen oxide radical as the reaction system can be used for the surface-treating. The generation of the halogen oxide radical may be performed in the aqueous phase provided separately, as will be described below, for example. On the other hand, when the liquid reaction system is a two-phase reaction system containing the organic phase and the aqueous phase, for example, the halogen oxide radical is generated in the aqueous phase, the generated halogen oxide radical is extracted from the aqueous phase in the organic phase, and an organic phase containing the aqueous phase and the halogen oxide radical can be used for the surface-treating as the two-phase reaction system.

The carbon allotrope is placed in the organic phase. When the carbon allotrope is the molded body, the molded body is preferably fixed in the organic phase such that a portion of the molded body to be surface-treated is immersed in the organic phase and is not exposed from the organic phase, for example.

(3B-2) Aqueous Phase

The aqueous phase is, for example, a phase of an aqueous solvent. The aqueous solvent is, for example, a solvent that is separated from the solvent used in the organic phase. Examples of the aqueous solvent include water such as $H_2O$ and $D_2O$.

The aqueous phase may contain any component such as a Lewis acid, a Brønsted acid, a radical source, or the like, as described below, for example. In the aqueous phase, these optional components may be, for example, dissolved or undissolved in the aqueous solvent. In the latter case, the optional component may be dispersed or precipitated in the aqueous solvent, for example.

(4) Surface-Treating

The surface-treating is reacting a surface of the carbon allotrope with a halogen oxide radical, as described above. In the surface-treating, the reaction system of the reaction may or may not be irradiated with light, for example. While a method in which the reaction system is irradiated with light will be mainly described below, the present invention is not limited thereto. The surface-treating is not particularly limited, as described above, as long as the carbon allotrope surface can be reacted with the halogen oxide radical, and the surface-treating may be performed without light irradiation. In such cases, for example, the surface-treating can be performed without light irradiating in the following description. As described above, no irradiation of the carbon allotrope with light allows safety to be improved, and costs to be reduced, for example.

The reaction system contains the carbon allotrope placed therein, and the carbon allotrope may be modified. Specifically, the present invention allows the carbon allotrope to be modified easily in the presence of the halogen oxide radical. The present invention allows the degree of modification of the carbon allotrope (e.g., the degree of modification such as oxidation) to be easily adjusted through adjustment of the amount of the halogen oxide radical, the light irradiation time, and the like, for example. Thus, for example, decomposition of the carbon allotrope due to excessive oxidation or the like can be prevented, and, for example, the characteristic inherent in the carbon allotrope can be prevented from being impaired.

In the surface-treating, when a methyl group is present on the carbon allotrope surface, a methyl group ($-CH_3$) is oxidized into, for example, at least one of a hydroxymethyl group ($-CH_2OH$), a formyl group ($-CHO$), and a carboxyl group ($-COOH$). This presumes the following mechanism. For example, the light irradiation generates a radical of the halogen (e.g., a chlorine radical ($Cl\cdot$)) and a molecule of the oxygen from the halogen oxide radical (e.g., a chlorine dioxide radical). Then, in the methyl group ($-CH_3$) on the carbon allotrope surface, a radical of the halogen (e.g., a chlorine radical ($Cl\cdot$)) functions as a hydrogen extracting agent and becomes a carbo radical ($-CH_2\cdot$), and then a molecule of the oxygen (e.g., $O_2$) functions as an oxidizing agent and becomes a hydroxymethyl group ($-CH_2OH$). The hydroxymethyl group ($-CH_2OH$) is further oxidized to a formyl group ($-CHO$) or a carboxy group ($-COOH$).

When an ethyl group is present on the carbon allotrope surface in the surface-treating, the ethyl group ($-CH_2CH_3$) is oxidized into, for example, a hydroxyethyl group ($-CH_2CH_2OH$), an acetaldehyde group ($-CH_2CHO$), or a carboxymethyl group ($-CH_2COOH$).

Further, for example, when the carbon allotrope surface has a methylene group ($-CH_2-$), for example, the methylene group is oxidized into a hydroxymethylene group ($-CHOH-$), a carbonyl group ($-CO-$), or the like.

In the surface-treating, the conditions of light irradiation are not particularly limited. The wavelength of the irradiation light is not particularly limited, and the lower limit is, for example, 200 nm or more and the upper limit is, for example, 800 nm or less. The light irradiation time is not particularly limited, and the lower limit is, for example, 1 second or more, the upper limit is, for example, 1000 hours. The reaction temperature is not particularly limited, and the lower limit is, for example, $-20°$ C. or more, the upper limit is, for example, $100°$ C. or less or $40°$ C. or less, and reaction temperature is, for example, in a range from $0°$ C. to $100°$ C., or from $0°$ C. to $40°$ C. The atmospheric pressure at the time of reaction is not particularly limited, and the lower limit is, for example, 0.1 MPa or more, the upper limit is, for example, 100 MPa or less, 10 MPa or less, or 0.5 MPa or less, and the atmospheric pressure is, for example, in the range from 0.1 to 100 MPa, 0.1 to 10 MPa, or 0.1 to 0.5 MPa. The reaction conditions during the surface-treating are, for example, a temperature from $0°$ C. to $100°$ C. or from $0°$ C. to $40°$ C., and a pressure from 0.1 to 0.5 MPa. As described above, for example, the surface-treating itself can be performed without light irradiation. The present invention allows the surface-treating or all steps including the surface-treating to be performed at normal temperature (room temperature) and normal pressure (atmospheric pressure) without heating, pressurizing, or decompressing, for example. The term "room temperature" is not particularly limited, and is, for example, $5°$ C. to $35°$ C. Therefore, even if the carbon allotrope includes, for example, a carbon allotrope having low heat resistance, it can be applied to the present invention. Further, the present invention allows the surface-treating or all steps including the surface-treating to be performed in atmosphere without substitution with inactive gas, for example.

The light source of the light irradiation is not particularly limited, and, for example, visible light included in natural light such as sunlight can be used. The natural light allows excitation to be performed in a simplified manner, for example. Further, as the light source, for example, as a substitute for or in addition to the natural light, light sources such as a xenon lamp, a halogen lamp, a fluorescent lamp, a mercury lamp, and an LED lamp can be used. In the light irradiation, for example, a filter for cutting wavelengths other than the necessary wavelengths further can be used as appropriate.

In the present invention, by irradiating only a freely-selected area of the carbon allotrope, only the freely-selected area can be modified. Such a method of controlling selective light irradiation is not particularly limited, and for example, only a freely-selected area may be irradiated with light, or only an area not to be irradiated with light may be masked and the whole area of the carbon allotrope may be irradiated with light.

When the reaction system is the liquid reaction system, for example, at least the organic phase may be irradiated with light in the surface-treating. In the case of a one-phase reaction system consisting only of the organic phase, for example, the surface-treating can be performed by irradiating the one-phase reaction system with light. In the case of a two-phase reaction system containing the organic phase and the aqueous phase, for example, only the organic phase may be irradiated with light, or the two-phase reaction system may be irradiated with light. In the case of the liquid reaction system, for example, the liquid reaction system may be irradiated with light while bringing the liquid reaction system into contact with air, and in the case of the two-phase reaction system, the liquid reaction system may be irradiated with light in a state where oxygen is dissolved in the aqueous phase.

The surface-treating of the present invention can modify the carbon allotrope by generating a radical of the halogen (e.g., a chlorine atom radical Cl·) and an oxygen molecule $O_2$ through, for example, really simple light irradiation in the presence of the halogen oxide radical to bring the carbon allotrope to react (e.g., oxidize). Then, for example, the present invention can change and modify the carbon allotrope efficiently in a simplified manner even under extremely mild conditions such as normal temperature and normal pressure.

According to the present invention, for example, a substance with a modified carbon allotrope surface is obtained without using a toxic heavy metal catalyst or the like. Therefore, as described above, for example, the carbon allotrope can be modified efficiently with the low load on the environment in addition to the reaction being performed under the very mild conditions.

As a method of oxidizing the carbon allotrope surface, for example, there is a method of using a strong oxidizing agent such as potassium permanganate ($KMnO_4$). However, such a method does not stay with the oxidation of the carbon allotrope surface, but may cleave the carbon-carbon bond of the skeleton and may decompose the carbon allotrope. In contrast, according to the surface-treating of the present invention, since the reaction can be performed under mild reaction conditions as described above, it is possible to suppress or prevent the cleavage of the carbon-carbon bond of the carbon allotrope skeleton. Further, according to the surface-treating of the present invention, it is easy to control the reaction condition. Specifically, for example, the reaction in the surface-treating can be optionally stopped by stopping the light irradiation, stopping the supply of the halogen oxide radical, and the like. Thus, for example, the cleavage of the carbon-carbon bond of carbon allotrope skeleton can be further suppressed, and, for example, the progress of the reaction of the carbon allotrope surface can be easily controlled. Therefore, according to the present invention, for example, it is possible to efficiently modify the carbon allotrope surface without decomposing carbon allotrope.

(5) Halogen Oxide Radical-Generating

The present invention may further include the step of generating a halogen oxide radical, for example. The halogen oxide radical-generating may be performed prior to or in parallel with the surface-treating, for example. How to generate the halogen oxide radical is not particularly limited.

In the halogen oxide radical-generating, for example, the halogen oxide radical may be generated using a radical generation reaction system. The reaction system in the surface-treating may be, for example, either the gas reaction system (gas phase) or the liquid reaction system (liquid phase). The radical generation reaction system after the generation of the halogen oxide radical may be used as it is as the liquid reaction system in the surface-treating, for example.

When the reaction system in the surface-treating is the gas reaction system, for example, the radical generation reaction system may be prepared separately from the reaction system in the surface-treating. The radical generation reaction system may be, for example, an aqueous phase containing a source of the halogen oxide radical. The aqueous phase includes, for example, a source of the halogen oxide radical, and in the generating the halogen oxide radical, the halogen oxide radical is generated from the source. The aqueous phase is, for example, a phase of an aqueous solvent, and the aqueous solvent is the same as described above. When the halogen oxide radical generated in the aqueous phase is hydrophobic, for example, the halogen oxide radical may be transferred into the organic phase using a two-phase reaction system containing the organic phase and the aqueous phase. As described above, in the case where the surface-treating is performed in the gas reaction system, the halogen oxide radical generation reaction system may be for example, either only an aqueous phase or a two-phase reaction system of an aqueous phase and an organic phase. When the halogen oxide radical is hydrophobic, for example, the radical generated in the aqueous phase can be transferred directly into the gas phase. Thus, the radical generation reaction system may be only the aqueous phase.

The reaction system in the surface-treating and the radical generation reaction system may be the reaction system shown in FIG. 1, for example. Specifically, first, a radical generation reaction system 5 is placed in a petri dish 3 as shown in FIG. 1. The radical generation reaction system 5 may be, for example, an aqueous phase containing a source of the halogen oxide radical. The source of the halogen oxide radical is not particularly limited, and is, for example, as described below. Meanwhile, a carbon allotrope 6 is placed in another petri dish 4. These petri dishes 3 and 4 are housed in yet another large petri dish 1, and a lid 2 is placed to prevent gas inside the petri dish 1 from leaking. Thereafter, the radical generation reaction system 5 in the petri dish 3 is irradiated with light. By this light irradiation, a gas of halogen oxide radical is generated in the petri dish 3, and the gas of the halogen oxide radical flows into the petri dish 4 to react with carbon allotrope 6. In this manner, the surface-treating can be performed. FIG. 1 illustrates an example in which the source of the halogen oxide radical in the radical generation reaction system 5 is a sodium chlorite aqueous solution ($NaClO_2$aq) and hydrochloric acid (HCl), and the halogen oxide radical generated by these reactions is chlorine dioxide radical ($ClO_2$). However, as described above, in the present invention, the source of the halogen oxide radical and the halogen oxide radical are not limited thereto.

When the reaction system in the surface-treating is the liquid reaction system which contains an aqueous phase, for example, the aqueous phase may be the radical generation reaction system. When the reaction system in the surface-treating is the gas reaction system, the aqueous phase may be, for example, the same as the radical generation reaction system. When the halogen oxide radical generated in the aqueous phase is hydrophobic, for example, the halogen oxide radical may be transferred into the organic phase using a two-phase reaction system containing the organic phase and the aqueous phase.

The source of the halogen oxide radical (radical generation source) is not particularly limited, and may be selected, as appropriate, according to the type of the halogen oxide radical, for example. One type or two or more types of the source of the halogen oxide radical may be used in combination, for example.

The source of the halogen oxide radical is, for example, a compound containing oxygen and halogen, and can be halous acid ($HXO_2$) or a salt thereof as a specific example. The salt of the halous acid is not particularly limited, and may be, for example, a metal salt, and examples of the metal salt include alkaline metal salts, alkaline earth metal salts, and rare earth salts. The source of the halogen oxide radical may be, for example, a compound containing oxygen, halogen, and a Group 1 element (e.g., at least one selected from the group consisting of H, Li, Na, K, Rb, and Cs), and can be, for example, the halous acid or an alkaline metal salt thereof. When the halogen oxide radical is the chlorine dioxide radical, the source is not particularly limited, and may be, for example, chlorous acid ($HClO_2$) or salts thereof, and specific examples thereof include sodium chlorite ($NaClO_2$), lithium chlorite ($LiClO_2$), potassium chlorite ($KClO_2$), magnesium chlorite ($Mg(ClO_2)_2$), and calcium chlorite ($Ca(ClO_2)_2$). Among them, from the viewpoint of cost, ease of handling, and the like, sodium chlorite ($NaClO_2$) is preferred. For example, a similar salt or the like can be employed for the source of other halogen oxide radicals. Examples of other source include bromates such as sodium bromate and iodates such as sodium phosphite.

The concentration of the source in the aqueous phase is not particularly limited. When the source is the compound, in terms of the halogen oxide ion concentration, the lower limit of the concentration thereof is 0.0001 mol/l or more and the upper limit thereof is 1 mol/l or less, for example, and, in terms of the number of moles of the halogen oxide ion, the lower limit of the concentration thereof is 1/100000 times or more of the number of moles of the raw material and the upper limit of the concentration thereof is 1000 times or less of the number of moles of the raw material, for example. When the source is halous acid or halite (e.g., chlorous acid or chlorite), in terms of a halite ion (e.g., chlorite ion ($ClO_2{-}$)) concentration, the lower limit of the concentration thereof is 0.0001 mol/l or more and the upper limit of the concentration thereof is 1 mol/l or less, for example, and in terms of the number of moles of the halite ion (e.g., chlorite ion ($ClO_2{-}$)), the lower limit of the concentration thereof is 1/100000 times or more of the number of moles of the raw material and the upper limit of the concentration thereof is 1000 times or less of the number of moles of the raw material, for example. The above-described concentrations can be applied also to other sources, for example.

The aqueous phase may further contain, for example, at least one of Lewis acid and Bronsted acid, which may act on the halogen oxide ion to generate the halogen oxide radical. At least one of the Lewis acid or Bronsted acid is, for example, at least one of Lewis acid and Bronsted acid containing the Group 1 element. The halogen oxide ion is, for example, a chlorite ion ($ClO_2{-}$). The aqueous phase contains, for example, either one of or both of the Lewis acid or Bronsted acid, or one substance serving as both of the Lewis acid and Bronsted acid. Only one type each of the Lewis acid and Bronsted acid may be used, or two or more types each of the Lewis acid and Bronsted acid may be used in combination. In the present invention, the "Lewis acid" refers to, for example, a substance serving as Lewis acid for the source of the halogen oxide radical.

The concentration of at least one of the Lewis acid and Bronsted acid in the aqueous phase is not particularly limited and can be set, as appropriate, according to the type of the carbon allotrope to be modified, for example. The lower limit of the concentration is 0.0001 mol/l or more and the upper limit of the concentration is 1 mol/l or less, for example.

The Brønsted acid is not particularly limited, and may be, for example, an inorganic acid or an organic acid. Specific examples of the Brønsted acid include trifluoromethanesulfonic acid, trifluoroacetic acid, acetic acid, hydrofluoric acid, hydrochloric acid, hydrobromic acid, hydroiodic acid, sulfuric acid, sulfurous acid, nitric acid, nitrous acid, phosphoric acid, and phosphorous acid. The acid dissociation constant $pK_a$ of the Brønsted acid is, for example, 10 or less. The lower limit of the $pK_a$ is not particularly limited, and is, for example, −10 or more.

It is preferred that the aqueous phase contains, for example, the halogen oxide ion and the Bronsted acid, and is, for example, an aqueous phase obtained by dissolving the compound and the Bronsted acid (e.g., hydrochloric acid) in an aqueous solvent. As a specific example, when the halogen oxide radical is a chlorine dioxide radical, it is preferred that the aqueous phase contains, for example, chlorite ion ($ClO_2{-}$) and Bronsted acid, and is, for example, an aqueous phase obtained by dissolving the sodium chlorite ($NaClO_2$) and the Bronsted acid (e.g., hydrochloric acid) in an aqueous solvent.

In the aqueous phase, the Lewis acid, the Bronsted acid, the radical generation source, and the like may be, for example, dissolved or undissolved in the aqueous solvent. In the latter case, these may be dispersed or precipitated in the aqueous solvent, for example.

The halogen oxide radical-generating is not particularly limited, and may be performed by bringing the source of the halogen oxide radical to be contained in the aqueous solvent to naturally generate the halogen oxide radical (e.g., a chlorine dioxide radical) from the halogen oxide ion (e.g., a chlorite ion). For example, it is preferable that the source be dissolved in the aqueous solvent in the aqueous phase, and it is preferable that the aqueous phase be left to stand. In the halogen oxide radical-generating, the coexistence of at least one of the Lewis acid and the Bronsted acid in the aqueous phase allows the generation of the halogen oxide radical to be further promoted, for example. In the halogen oxide radical-generating, for example, the irradiation of the aqueous phase with light also allows the generation of the halogen oxide radical, but mere standing still of the aqueous phase also allows the generation of the halogen oxide radical.

The mechanism of generating the halogen oxide radical from the halogen oxide ion in the aqueous phase is presumed to be the same as in FIG. 15 (a liquid phase reaction system, a two-phase system of an organic phase and an aqueous phase), for example, which will be described below. It is to be noted, however, that this description is merely an illustrative example, and by no means limits the present invention.

When the reaction system is the liquid reaction system, and a two-phase reaction system of the organic phase and the aqueous phase, as described above, the liquid reaction system after generation of the halogen oxide radical may be applied as it is to the surface-treating. Since the halogen oxide radical generated from the source in the aqueous phase in the reaction system is hardly dissolved in water, the halogen oxide radical is dissolved in the organic phase in the reaction system. For example, the liquid reaction system containing the halogen oxide radical generated may be irradiated with light to perform the surface-treating of modifying the carbon allotrope surface. In this case, for example, the halogen oxide radical-generating and the surface-treating can be performed continuously by irradiating the liquid reaction system with light. In the present invention, the halogen oxide radical-generating and the surface-treating in the two-phase reaction system achieve higher reaction efficiency, for example.

On the other hand, when the reaction system in the surface-treating is the liquid reaction system, and a one-phase reaction system only containing the organic phase, for example, the halogen oxide radical is generated in the aqueous phase in the manner described above, the generated halogen oxide radical is dissolved (extracted) in the organic phase, the aqueous phase is then removed, and the organic phase containing the halogen oxide radical may be applied, as the one-phase reaction system, to the surface-treating.

Figure 15:
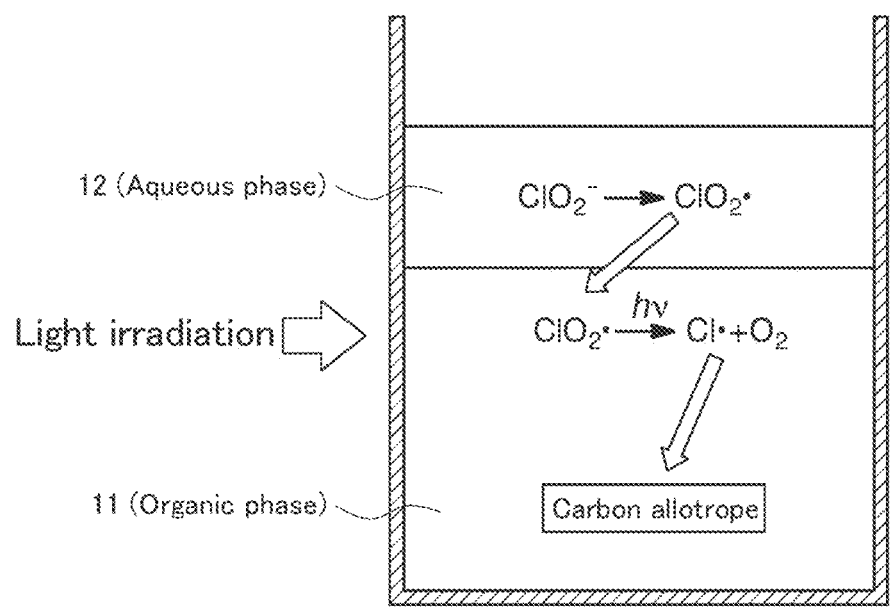
FIG. 15 is a diagram schematically showing an example of surface-treating using a liquid reaction system.

FIG. 15 schematically illustrates an example of the halogen oxide radical-generating and the surface-treating using the two-phase reaction system. While FIG. 15 shows the chlorine dioxide radical as a specific example of the halogen oxide radical, the present invention is not limited by this example. As shown in FIG. 15, in the reaction system, two layers of an aqueous layer (the aqueous phase) and an organic layer (the organic phase) are separated in a reaction container, and are in contact with each other only at interfaces. An upper layer is the aqueous layer (the aqueous phase) 12, and a lower layer is the organic layer (the organic phase) 11. It is to be noted that, while FIG. 15 is a cross-sectional view, for viewability, hatching of the aqueous layer 12 and organic layer 11 is omitted. Because the chlorine dioxide radical ($ClO_2\cdot$) is water-insoluble, it is dissolved in the organic layer 11. Subsequently, by irradiating the organic layer 11 containing the chlorine dioxide radical ($ClO_2\cdot$) with light and applying light energy to the organic layer 11, the chlorine dioxide radical ($ClO_2\cdot$) in the organic layer 11 is decomposed, thereby generating a chlorine radical ($Cl\cdot$) and an oxygen molecule ($O_2$). Thus, a carbon allotrope in the organic layer (organic phase) 11 is oxidized, and the surface is modified. It is to be noted, however, that FIG. 15 shows merely an illustrative example and by no means limits the present invention.

While the aqueous layer 12 is the upper layer and the organic layer 11 is the lower layer in FIG. 15, for example, if the organic layer 11 has lower density (specific gravity) than the aqueous layer 12, the organic layer 11 serves as the upper layer. The carbon allotrope may be immobilized in the reaction vessel such that the carbon allotrope is placed in the upper organic layer. In this case, the site where the carbon allotrope is immobilized may be provided in the reaction vessel or may be provided outside the reaction vessel, for example. In the latter case, for example, the carbon allotrope may be suspended from the outside and immersed in the organic layer.

Although FIG. 15 shows the two-phase reaction system, the surface-treating may also be performed in a one-phase reaction system containing only an organic phase in the production method according to the present invention. In this case, for example, an aqueous phase containing a source of the halogen oxide radical is prepared separately to generate the halogen oxide radical in the aqueous phase, the organic phase is then mixed with the aqueous phase to dissolve (extract), in the organic phase, the halogen oxide radical generated in the aqueous phase. Then, the aqueous phase and the organic phase are separated from each other, the organic phase is recovered, and the carbon allotrope is placed therein. Using this as a one-phase reaction system, the surface-treating is independently performed by light irradiation in the presence of the halogen oxide radical. When the reaction system in the surface-treating is the gas reaction system, as described above, the surface-treating may be performed in the gas reaction system after generation of the halogen oxide radical in the aqueous phase.

[2. Method for Producing Substance with Carbon Allotrope Surface into which Functional Group is Introduced]

As described above, the method for producing a substance with a carbon allotrope surface into which a functional group is introduced of the present invention includes the steps of: producing a substance with a modified carbon allotrope surface by the method of producing a substance with a modified carbon allotrope surface according to the present invention; and introducing a functional group into the modified surface.

By introducing the functional group, various functions can be imparted to the carbon allotrope. Specifically, for example, as shown in Examples described below, the functional group makes it easy to capture a structural analysis target substance (e.g., a protein) to be analyzed by cryo-electron microscopy. In addition, for example, by appropriately selecting the type of the functional group, any function corresponding to the type of the functional group can be imparted.

In the functional group-introducing, for example, a functional group can be introduced into an oxidized (modified) carbon allotrope surface into which a substituent such as a hydroxy group, a carboxy group, or an aldehyde group (formyl group) has been introduced through reaction (e.g., condensation reaction) between the substituent such as the hydroxy group, the carboxy group, or the aldehyde group and another substance. According to this, for example, any functional group which can be introduced through reaction with the substituent (e.g., a hydroxy group, a carboxy group, an aldehyde group, or the like) that has been introduced into the carbon allotrope surface can be introduced.

The functional group-introducing can be, for example, Scheme E3 of Example 3 described below. Specifically, for example, as shown in the reaction formula on the left side of Scheme E3, the hydrogen of the carboxy group introduced into the carbon allotrope surface can be substituted with a succinimide group. Then, as shown in the reaction formula, further condensation reaction with 1H,1H-undecafluorohexylamine generates an amide bond. Further, for example, as shown in the reaction formula on the right side of Scheme E3, the hydrogen of the hydroxy group introduced into the carbon allotrope surface can be substituted with a 2,3-epoxypropyl group. Further, as shown in the reactive group, an addition reaction can be performed between the epoxy group and 1H,1H-undecafluorohexylamine. Although nanodiamond is used as carbon allotrope in Example 3, the present invention is not limited to nanodiamond, and any other carbon allotrope may be used. Further, amine is not limited to 1H,1H-undecafluorohexylamine, and any other amine may be used. The amine is not particularly limited, and may be, for example, a primary amine or a secondary amine.

Further, a functional group to be introduced by the functional group-introducing is not particularly limited, and as described above, any functional group which can be introduced through reaction with the substituent (e.g., a hydroxy group, a carboxy group, an aldehyde group, or the like) that has been introduced into the carbon allotrope surface can be introduced, for example. Specifically, for example, a functional group such as a succinimidyl group, an isothiocyano group, a sulfonic acid chloride group, a carboxylic acid chloride group, an ethylene oxide group, an alkyl chloride group, a carboxylic acid anhydride group, a maleimide group, or a hydrazide can be introduced into the carbon allotrope surface through reaction with a substituent such as a hydroxy group, a carboxy group, or an aldehyde group of the carbon allotrope surface. Since the functional group thus introduced can react with a group such as an amino group, a sulfhydryl group (also referred to as —SH, a mercapto group, or a thiol group), an aldehyde group, or the like, for example, a compound having these groups (e.g., a protein or the like) can be bonded and captured.

The reaction conditions in the functional group-introducing are not particularly limited, and can be set appropriately. The reaction conditions may be the same as or similar to the reaction conditions of existing identical or similar reactions, for example. For example, when a functional group is introduced through reaction with a hydroxy group or a carboxy group, reaction conditions the same as or similar to the reaction conditions for an existing reaction of a hydroxy group or a carboxy group may be used.

[3. Organic Substance]

As described above, the first organic substance according to the present invention is an organic substance with a carbon allotrope surface into which at least one substituent selected from the group consisting of a hydroxy group, a carboxy group, and an aldehyde group is introduced, and further the substituent is converted into another functional group. Further, the second organic substance according to the present invention is an organic substance with a diamond-like carbon (DLC) surface into which a functional group is introduced.

The method for producing an organic substance of the present invention is not particularly limited, and the organic substance can be produced, for example, by the method for producing a substance with a carbon allotrope surface into which a functional group is introduced of the present invention. This production method includes, as described above, the steps of surface-treating and functional group-introducing.

Further, for example, it is also possible to produce an organic substance of the present invention by performing the functional group-introducing on the carbon allotrope without performing the surface-treating. More specifically, for example, if the carbon allotrope surface which is not subjected to the surface-treating has substituents such as a hydroxy group, a carboxy group, and the like, the organic substance of the present invention can be produced by performing the functional group-introducing on those substituents.

[4. Grid for Cryo-Electron Microscopy, Etc.]

The use of the organic substance of the present invention is not particularly limited, and the organic substance can be used in a grid for cryo-electron microscopy of the present invention as described above, for example.

By binding a structural analysis target substance to be analyzed by cryo-electron microscopy to the functional group, the grid for cryo-electron microscopy of the present invention can suppress or prevent uneven distribution, uneven orientation, and the like of the structural analysis target substance, for example. The bond between the functional group and the structural analysis target substance is not particularly limited, and examples thereof include a covalent bond, an ionic bond, a metal coordination bond, a host-guest interaction, and a hydrogen bond, and a covalent bond is particularly preferred from the viewpoint of strength of the bond.

Since conventional carbon grids for cryo-electron microscopy had a weak binding force between the grid and the structural analysis target substance, as described above, there was a possibility of uneven distribution (localization), uneven orientation, and the like of the structural analysis target substance occurring on the carbon grid, which may hinder the structural analysis. In contrast, the grid for cryo-electron microscopy of the present invention can strongly bind with the structural analysis target substance as described above. Thereby, uneven distribution, uneven orientation, and the like of the structural analysis target substance can be suppressed or prevented.

The method of binding the structural analysis target substance to the functional group is not particularly limited. For example, depending on the combination of the functional group and the structural analysis target substance, the same or similar reaction conditions as those of known similar reactions can be appropriately set. For example, the grid for cryo-electron microscopy of the present invention having the functional group may be immersed in a solution (e.g., an aqueous solution) of the structural analysis target substance for an appropriate time, however, the present invention is not limited to this method.

The structural analysis target substance is not particularly limited, and may be, for example, the same as or different from a general structural analysis target substance of cryo-electron microscopy. Examples of the structural analysis target substance include proteins, antibodies, nucleic acids, viruses, ribosomes, mitochondria, ion channels, enzymes, and enzyme complexes. Examples of the protein include, in the case of classifying by physical properties, membrane proteins, water-soluble proteins, and glycoproteins, and include, in the case of classifying by functions, enzymatic proteins, structural proteins, transcription factors, transporting proteins, storage proteins, contractile proteins, and protection proteins. Examples of the protein include, besides apoferritin used as a reference protein for analysis, ribosomes, proteasomes, RNA polymerases, capsids, GPCR, photochemical complexes, ATP synthetases, and complexes with antibodies. In addition to them, tubulin or the like composed of these can be the structural analysis target substance in the present invention. Further, examples of the structural analysis target substance in the present invention include tissue itself such as muscle, collagen, and flagella. Moreover, for example, a living body itself, a tissue surface, or the like can be used as the structural analysis target substance in the present invention by using an antibody or the like as a labeled protein.

The grid for cryo-electron microscopy of the present invention can suppress or prevent the uneven distribution, uneven orientation, and the like of the structural analysis target substance as described above. Further, the grid for cryo-electron microscopy of the present invention can analyze the structure of a substance which has been difficult to be analyzed by a conventional grid for cryo-electron microscopy. For example, since a membrane protein and the like are difficult to crystallize, it has been difficult to analyze the three-dimensional structure of the membrane protein by a conventional grid for cryo-electron microscopy. In contrast, since the grid for cryo-electron microscopy of the present invention can strongly bind to a structural analysis target substance such as the membrane protein to stabilize the structure, the structural analysis can be performed, and for example, three dimensional structural analysis can be performed. Further, the grid for cryo-electron microscopy of the present invention can perform, for example, a single particle analysis of a protein or the like.

The usage of the grid for cryo-electron microscopy of the present invention is not particularly limited, and may be, for example, the same method as that of a general grid for cryo-electron microscopy. For example, similar to a general grid for cryo-electron microscopy, a structure analysis can be performed by observing the captured structural analysis target substance by a microscopy using the Vitreous Ice Embedding method.

Further, the use of the organic substance of the present invention is not limited to a grid for cryo-electron microscopy, and can be used in any wide range of applications, and can be used, for example, in applications such as a bioreactor, an enzyme sensor, a microreactor, and the like, and also in detection reagents when an antibody or various proteins are linked to a bead or the like, affinity column chromatography, and the like.

EXAMPLES

Next, Examples of the present invention will be described. It is to be noted, however, that the present invention is by no means limited to the following examples.

Example 1

A carbon allotrope surface was modified by the surface-treating of the present invention to produce a substance with a modified carbon allotrope surface.

In the present example, the surface-treating using a reaction in a gas phase was performed.

First, as shown in FIG. 1, 20 ml of deionized water was added to a 5-cm-diameter petri dish 3, and then sodium chlorite ($NaClO_2$) (300 mg) and a 36% by mass HCl aqueous solution (100 μl) were dissolved to obtain a hydrochloric acid acidity $NaClO_2$ aqueous solution (radical generation reaction system) 5. On the other hand, 10 mg of the carbon allotrope 6 was placed in a 3-cm-diameter petri dish 4. These petri dishes 3 and 4 were housed in a 11-cm-diameter petri dish 1. In addition, a lid 2 was placed on the petri dish 1 to prevent gas inside the petri dish 1 from leaking. Thereafter, the hydrochloric acid acidity $NaClO_2$ aqueous solution 5 in the petri dish 3 was irradiated from above the petri dish 1 with an LED light having a wavelength of 365 nm for 3 minutes, 10 minutes, 30 minutes, or 60 minutes at room temperature and at a light amount of 10 $mW/cm^2$. By this light irradiation, hydrochloric acid and $NaClO_2$ reacted in the petri dish 3 to generate a gas of $ClO_2$ radical, and the gas of $ClO_2$ radical flowed into the petri dish 4 to react with the carbon allotrope 6. By this surface-treating, the carbon allotrope 6 surface was oxidized. The carbon allotrope 6 after oxidation was dried under reduced pressure for 24 hours to obtain a target object (a substance with a modified carbon allotrope 6 surface).

In the present embodiment, as the carbon allotrope 6, powdery graphene (FUJIFILM Wako Pure Chemical Corporation, trade name: "06-0313"), carbon nanotube (MEIJO NANO CARBON Co., Ltd., trade name: "MEIJO eDIPS"), fullerene $C_{60}$ (Tokyo Kasei Kogyo Co., Ltd., trade name: "B1641"), nanodiamond (Daicel Corporation) and diamond-like carbon (prepared by the physical vapor deposition (PVD) method using graphene as a raw material) were used to produce substances with modified carbon allotrope 6 surfaces. Incidentally, the carbon nanotube was a single-walled carbon nanotube (SWNT).

The progress of the oxidation reaction in each carbon allotrope 6 was examined by X-ray photoelectron spectroscopy (XPS) measurement before and after the surface-treating (oxidation reaction) to detect the energy-peak position of Cis (is orbital of carbon atom). The graphs of FIGS. 2 to 6 show the results of the respective XPS measurements.

In each drawing, the horizontal axis indicates the binding energy (eV) and the vertical axis indicates the relative value of the peak intensity (cps).

Figure 2:
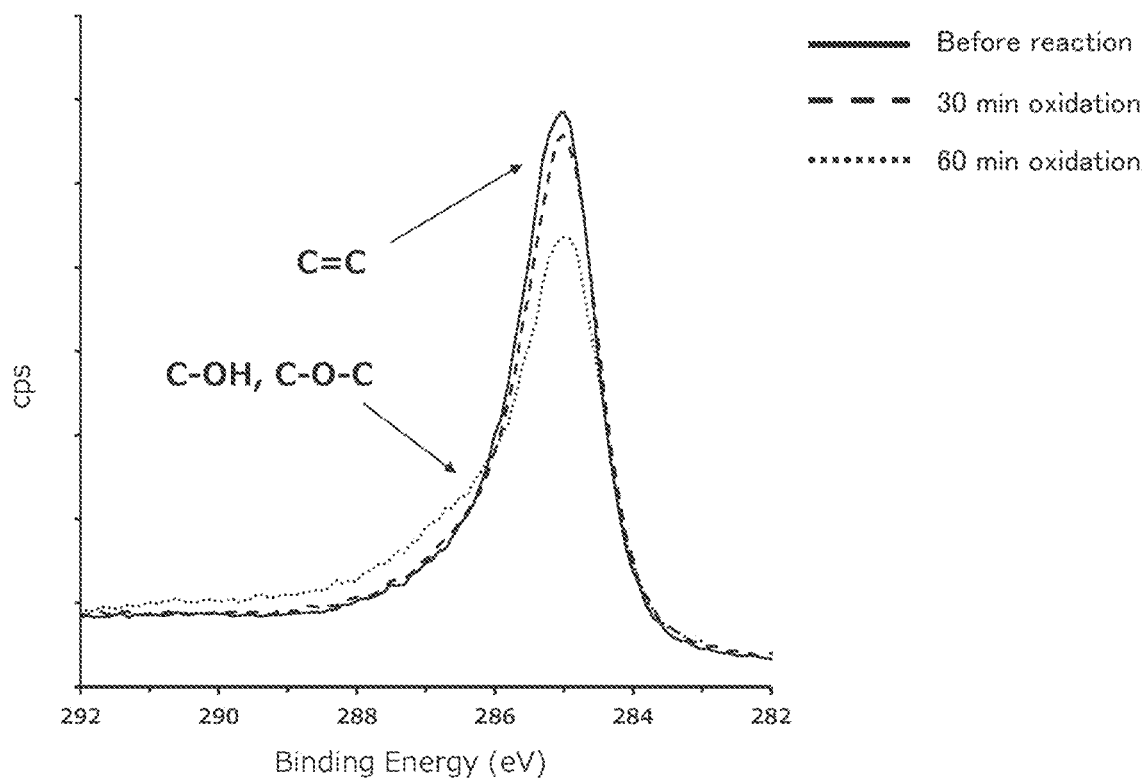
FIG. 2 is a graph showing the XPS measurement results of graphene before and after surface-treating (oxidation reaction) in Examples.

FIG. 2 shows the XPS measurement results before and after the surface-treating (oxidation reaction) of graphene. As shown in FIG. 2, there was no major change 30 minutes after reaction, but decrease of the C=C bond peak, and increase of the C—OH bond peak and C—O—C bond peak were observed 60 minutes after reaction, whereby oxidation of the graphene surface was verified. Further, elemental analysis results by the XPS are summarized in Table 1 below. As summarized in Table 1, the ratio of the number of O atoms was increased after the oxidation reaction, which also verifies the oxidation of the graphene surface.

TABLE 1

| Element ratio of graphene | | |
|---|---|---|
| | O | C |
| Before reaction | 5.4 | 94.6 |
| 30 min after oxidation reaction | 8.3 | 91.6 |
| 60 min after oxidation reaction | 11.4 | 87.8 |

Further, it is presumed that, for example, the structure of the graphene surface after oxidation in the present example is as shown by the following chemical formula E1. However, this structure is only an example of a presumable structure.

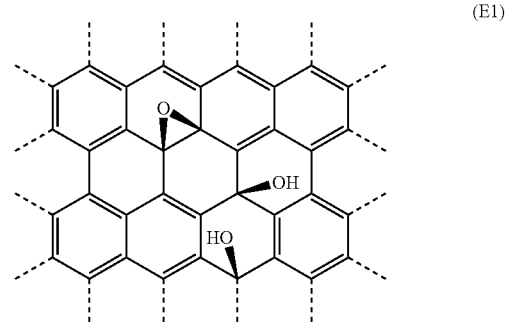

(E1)

Figure 3:
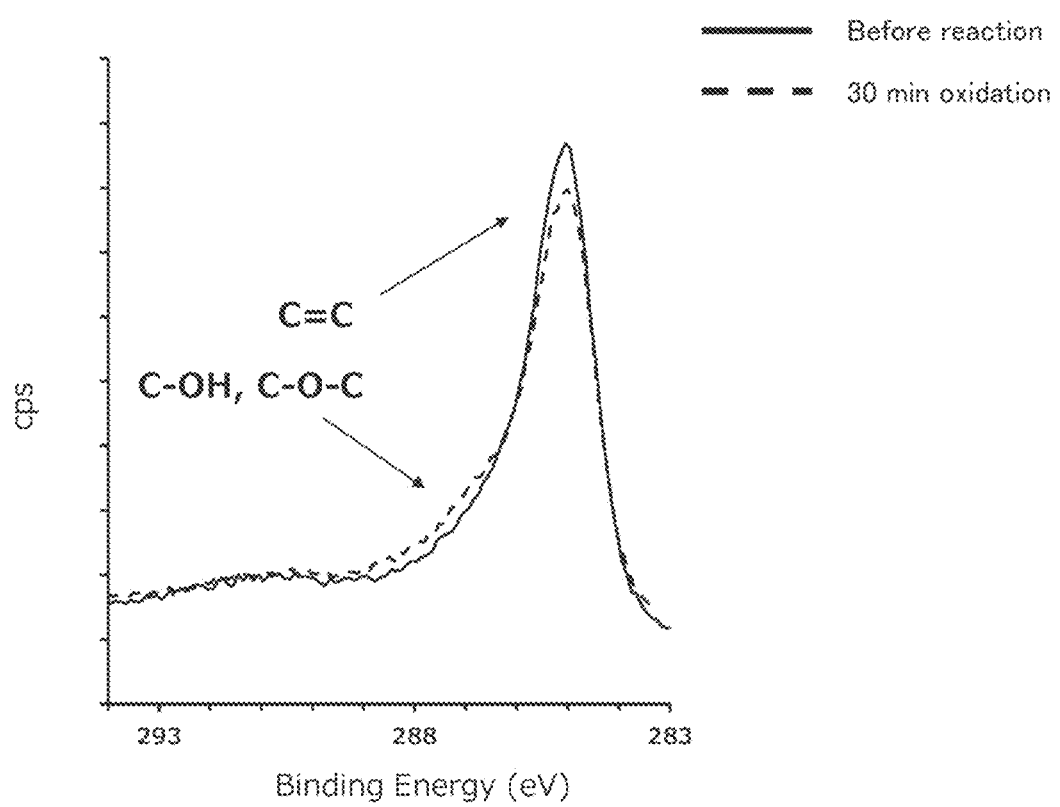
FIG. 3 is a graph showing the XPS measurement results of carbon nanotube before and after surface-treating (oxidation reaction) in Examples.

FIG. 3 shows the XPS measurement results before and after the surface-treating (oxidation reaction) of carbon nanotube. As shown in FIG. 3, decrease of the C=C bond peak, and increase of the C—OH bond peak and C—O—C bond peak were observed 30 minutes after reaction, whereby oxidation of the carbon nanotube surface was verified. Further, elemental analysis results by the XPS are summarized in Table 2 below. As summarized in Table 2, the ratio of the number of O atoms was increased after the oxidation reaction, which also verifies the oxidation of the carbon nanotube surface.

TABLE 2

| Element ratio of carbon nanotube | | |
|---|---|---|
| | O | C |
| Before reaction | 14.7 | 85.3 |
| 30 min after oxidation reaction | 22.1 | 76.3 |

Further, it is presumed that, for example, the structure of the carbon nanotube surface after oxidation in the present example is as shown by the following chemical formula E2. However, this structure is only an example of a presumable structure.

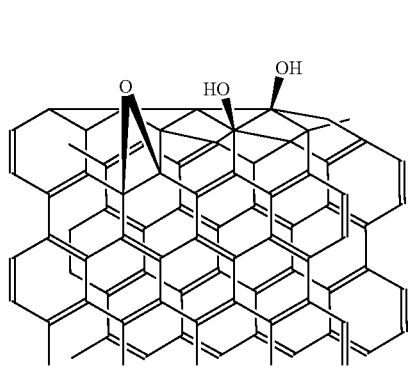

(E2)

Figure 4:
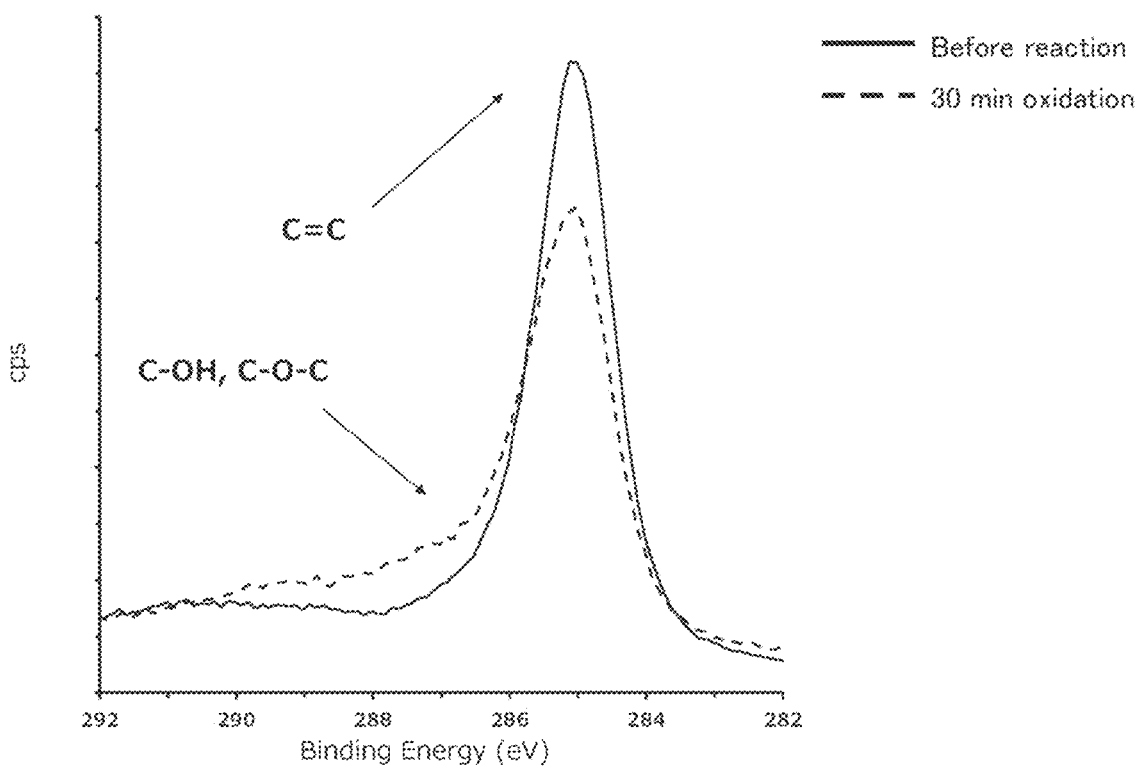
FIG. 4 is a graph showing the XPS measurement results of fullerene before and after surface-treating (oxidation reaction) in Examples.

FIG. 4 shows the XPS measurement results before and after the surface-treating (oxidation reaction) of fullerene. As shown in FIG. 4, decrease of the C=C bond peak, and increase of the C—OH bond peak and C—O—C bond peak were observed 30 minutes after reaction, whereby oxidation of the fullerene surface was verified. Further, elemental analysis results by the XPS are summarized in Table 3 below. As summarized in Table 3, the ratio of the number of O atoms was increased after the oxidation reaction, which also verifies the oxidation of the fullerene surface.

TABLE 3

Element ratio of fullerene

|  | O | C |
|---|---|---|
| Before reaction | 6.5 | 93.3 |
| 30 min after oxidation reaction | 27.2 | 71.7 |

Figure 7:
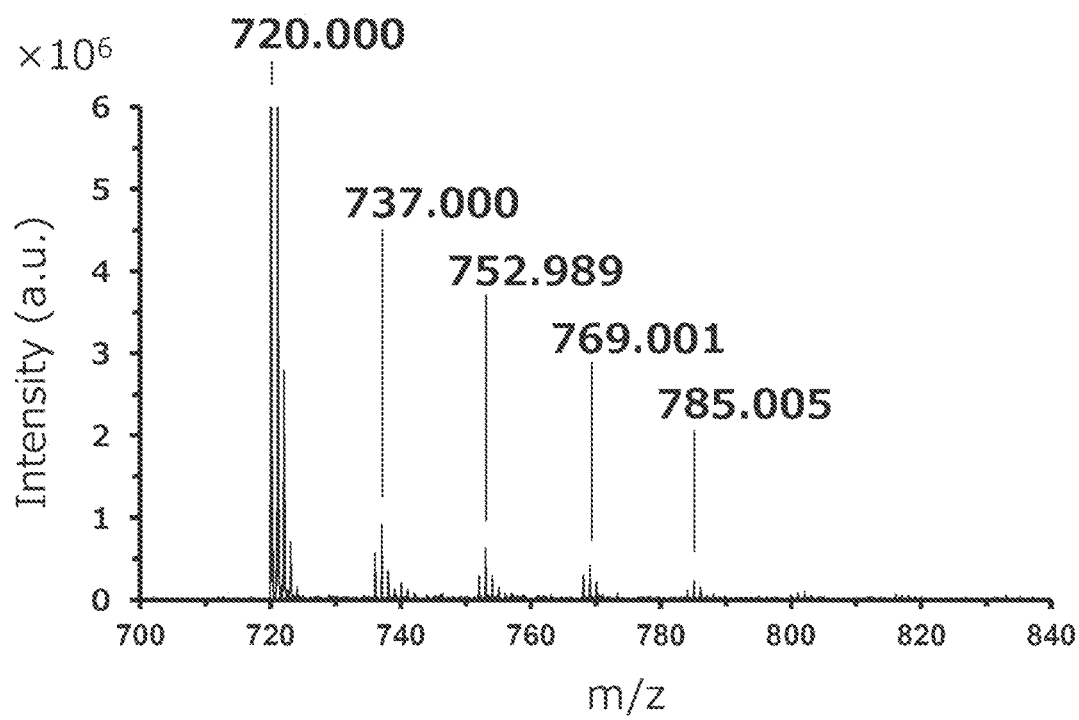
FIG. 7 is a graph showing the MALDI/TOFMAS measurement results of fullerene after the oxidation reaction in Examples.

Furthermore, the MALDI/TOFMAS measurement results of fullerene after the oxidation reaction are shown in the graph of FIG. 7. In FIG. 7, the horizontal axis indicates the mass (m/z) and the vertical axis indicates the peak intensity (relative value). As shown in FIG. 7, in addition to the original peak of fullerene $C_{60}$ (m/z=720), plural peaks with m/z increasing in increments of 16 or 17 were observed. From this, it can be inferred the oxidation of the fullerene surface.

Moreover, it was verified that the fullerene after the oxidation reaction was slightly dissolved in water and exhibited a pale brown color. From this, it can be inferred that the fullerene surface was oxidized and its hydrophilicity was slightly increased.

Further, it is presumed that, for example, the structure of the fullerene surface after oxidation in the present example is as shown by the following chemical formula E3. However, this structure is only an example of a presumable structure.

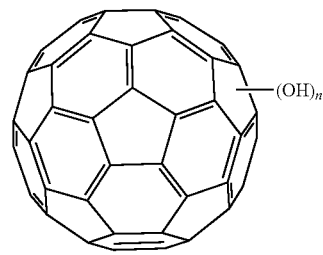

(E3)

Figure 5:
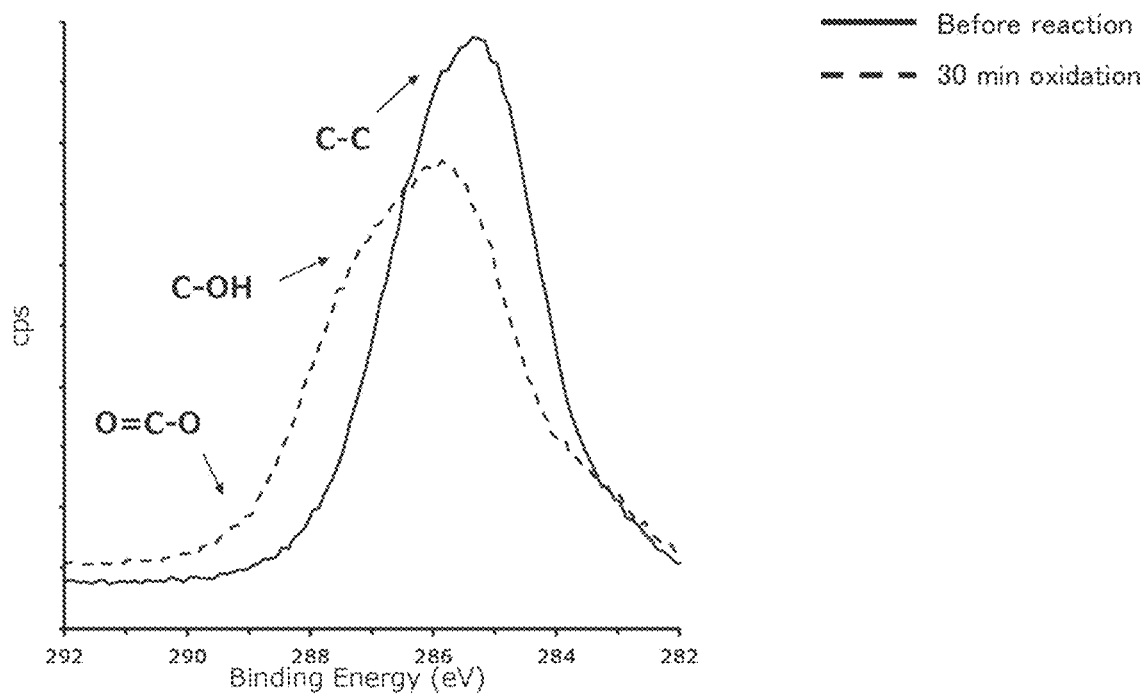
FIG. 5 is a graph showing the XPS measurement results of nanodiamond before and after surface-treating (oxidation reaction) in Examples.

FIG. 5 shows the XPS measurement results before and after the surface-treating (oxidation reaction) of nanodiamond. As shown in FIG. 5, decrease of the C—C bond peak, and increase of the C—OH bond peak and C=O—C bond peak were observed 30 minutes after reaction, whereby oxidation of the nanodiamond surface was verified. Further, elemental analysis results by XPS are summarized in Table 4 below. As summarized in Table 4, the ratio of the number of O atoms was increased after the oxidation reaction, which also verifies the oxidation of the nanodiamond surface.

TABLE 4

Element Ratio of nanodiamond

|  | O | C |
|---|---|---|
| Before reaction | 7.9 | 90.7 |
| 30 min after oxidation reaction | 15.6 | 83.7 |

Further, it is presumed that, for example, the structure of the nanodiamond surface after oxidation in the present example is as shown by the following chemical formula E4. However, this structure is only an example of a presumable structure.

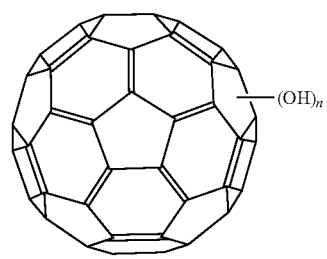

(E3)

Figure 6:
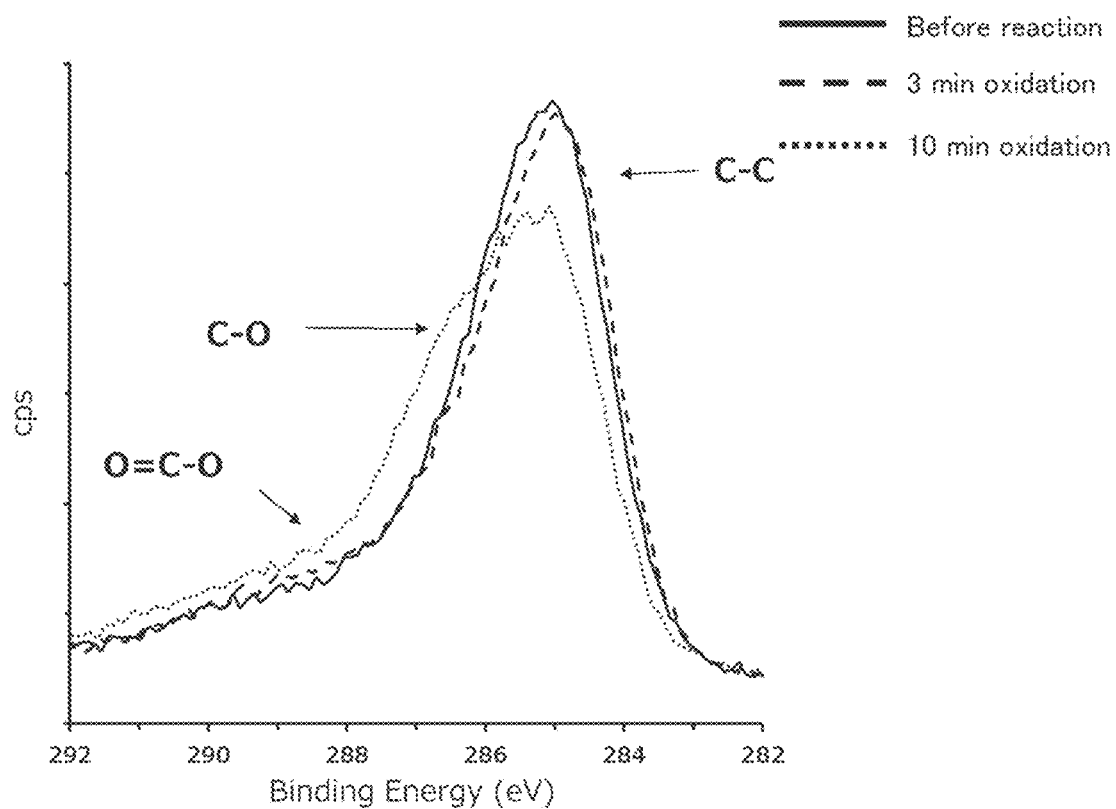
FIG. 6 is a graph showing the XPS measurement results of diamond-like carbon before and after surface-treating (oxidation reaction) in Examples.

FIG. 6 shows XPS measurement results before and after the surface-treating (oxidation reaction) of diamond-like carbon. As shown in FIG. 6, there was no major change 3 minutes after reaction, but decrease of the C—C bond peak, and increase of the C—OH bond peak and C=O—C bond peak were observed 10 minutes after reaction, whereby oxidation of the diamond-like carbon surface was verified. Further, according to the elemental analysis by the XPS, the ratio of the number of O atoms after the oxidation reaction is increased, which also verifies the oxidation of the diamond-like carbon surface. Further, it is presumed that the structure of the diamond-like carbon surface after oxidation in the present example is the same as that after oxidation of nanodiamond, for example. However, this structure is only an example of a presumable structure. Further, elemental analysis results by the XPS are summarized in Table 5 below. As summarized in Table 5, the ratio of the number of O atoms was increased after the oxidation reaction, which also verifies the oxidation of the diamond-like carbon surface.

TABLE 5

Element Ratio of DLC

|  | O | C |
|---|---|---|
| Before reaction | 27.5 | 72.5 |
| 10 min after oxidation reaction | 33.3 | 64.1 |

Further, Table 6 below shows the change in the oxygen content before and after the oxidation reaction of graphene (GP), carbon nanotube (SWNT), fullerene ($C_{60}$), and nanodiamond (ND) in the present embodiment. As shown in Table 6, it was suggested that the carbon allotrope (GP, SWNT, and $C_{60}$) composed only of $sp^2$ bonds was more reactive with larger radii of curvature because the oxygen content increased significantly after the reaction. In addition, it is inferred from the XPS measurement results that a OH group was introduced into $sp^2$ and a OH group and a COOH group were introduced into carbon $sp^3$, respectively, in each of the oxidation reactions.

TABLE 6

Change in Oxygen Content

|  | GP | SWNT | $C_{60}$ | ND |
|---|---|---|---|---|
| Before reaction | 5.4 | 14.7 | 6.5 | 7.9 |
| 30 min after oxidation reaction | 8.3 | 22.1 | 27.2 | 15.6 |
| 60 min after oxidation reaction | 11.4 | — | — | — |
| Change amount | +6.0 | +7.4 | +20.7 | +7.7 |

Example 2

Rhodamine B was bonded to the graphene and nanodiamond of Example 1 in the following manner, and the fluorescence intensity was measured.

First, 6 mg of Rhodamine B was added to a test tube. Next, 2 ml of deionized water was added thereto, and then 0.1 M acetic acid aqueous solution was added to achieve the pH of 6.5. Four of these were prepared, and graphene before the oxidation reaction, graphene after 60 minutes of the oxidation reaction, nanodiamond before the oxidation reaction, and nanodiamond after 30 minutes of the oxidation reaction were added thereto, respectively, and stirred at room temperature for 15 minutes. After each reaction, the resultant was washed twice using 3 ml of deionized water and dried under reduced pressure for 24 hours. Thereafter, the fluorescence intensity of each resultant was measured using a UV-vis spectrometer with the exciting light at 555 nm in the range from 560 to 660 nm.

Figure 8:
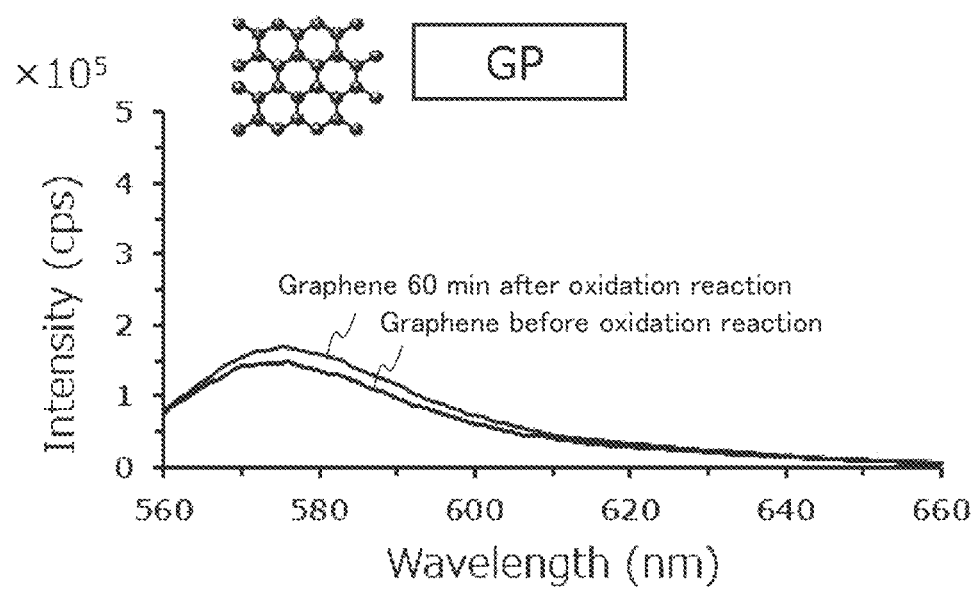
FIG. 8 is a graph showing the fluorescence intensity measurement results of graphene to which rhodamine B is bonded in Examples.
Figure 9:
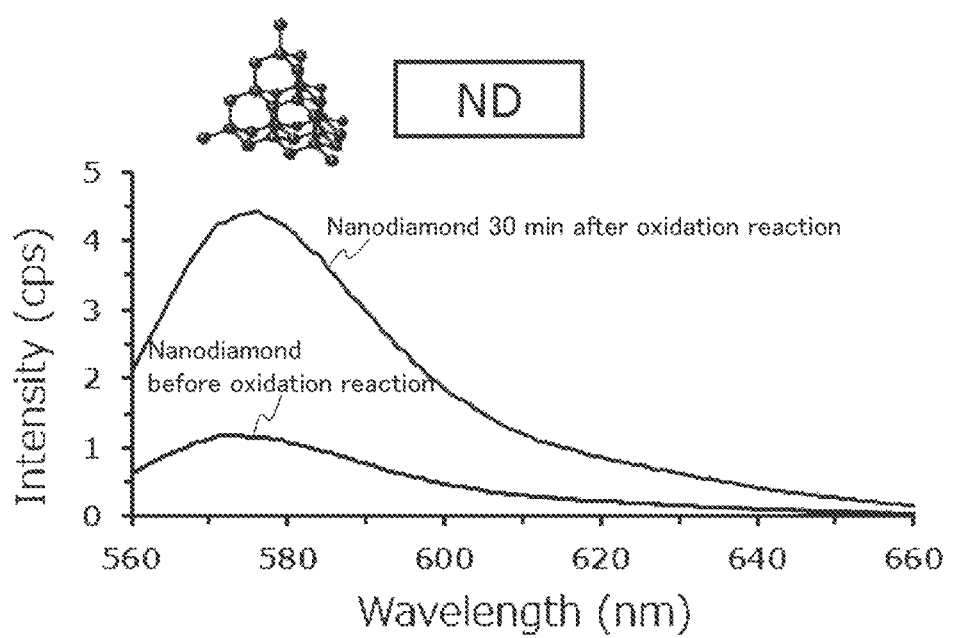
FIG. 9 is a graph showing the fluorescence intensity measurement results of nanodiamond to which rhodamine B is bonded in Examples.

FIG. 8 shows the fluorescence intensity measurement graphene and FIG. 9 shows the fluorescence intensity measurement of nanodiamond. In each of FIGS. 8 and 9, the horizontal axis indicates the wavelength (nm) and the vertical axis indicates the peak intensity (relative value). As shown in FIGS. 8 and 9, the peak intensity at around 575 nm was increased after the oxidation reaction in both of graphene and nanodiamond, which verified that rhodamine B was bonded thereto. From this fact, it was inferred that a hydroxy group or a carboxy group or both of them have been introduced into the surface of the graphene and nanodiamond after the oxidation reaction.

Example 3

A NHS (N-hydroxysuccinimide) group and a 2,3-epoxypropyl group were each introduced into nanodiamond of Example 1 in the following manner, and the resultants were substituted with a fluoroalkylamino group.

[Functional Group Introduction Using N-Hydroxysulfosuccinimide]

The nanodiamonds before and after the oxidation reaction in Example 1 were each placed in a separate test tube. Subsequently, 100 mM 1-(3-dimethylaminopropyl)-3-ethylcarbodiimide hydrochloride (1-(3-dimethylaminopropyl)-3-ethylcarbodiimide hydrochloride, sometimes abbreviated as EDC) aqueous solution (2 mL) was added and stirred at room temperature for 60 minutes. Thereafter, 80 mg of N-hydroxysulfosuccinimide (N-hydroxysulfosuccinimide) was added, and the mixture was further stirred at room temperature for 60 minutes to react. Thereby, an organic substance with nanodiamond into which an NHS (N-hydroxysuccinimide) group was introduced was obtained. Further, 40 μl of 1H,1H-undecafluorohexylamine was added and stirred for 60 minutes to react, thereby obtaining an organic substance in which the NHS group was substituted with a fluoroalkylamino group. The resulting organic substance was washed twice with deionized water and dried under reduced pressure for 24 hours.

[Functional Group Introduction Using Epichlorohydrin]

The nanodiamonds before and after the oxidation reaction in Example 1 were each placed in a separate test tube. Next, 100 mM epichlorohydrin aqueous solution (2 mL) was added and stirred at room temperature for 60 minutes to react, thereby obtaining an organic substance with nanodiamond into which a 2,3-epoxypropyl group was introduced. Further, 40 μl of 1H,1H-undecafluorohexylamine was added and stirred for 60 minutes to react, thereby obtaining an organic substance with nanodiamond into which a fluoroalkylamino group was introduced. The resulting organic substance was washed twice with deionized water and dried under reduced pressure for 24 hours.

Note that the functional group introduction reaction in the present example is presumed as shown by Scheme E3 below. The reaction formula on the left shows the reaction using N-hydroxysulfosuccinimide (Sulfo-NHS). As described below, it is considered that the hydrogen of the carboxy group on the nanodiamond surface was substituted with a succinimide group, and further, an amide bond was generated by condensation reaction with 1H,1H-undecafluorohexylamine. In addition, the reaction formula on the right shows the reaction using epichlorohydrin. As described below, it is considered that the hydrogen of the hydroxy group on the nanodiamond surface was substituted with a 2,3-epoxypropyl group, and further, an addition reaction was generated between the epoxy group and 1H,1H-undecafluorohexylamine.

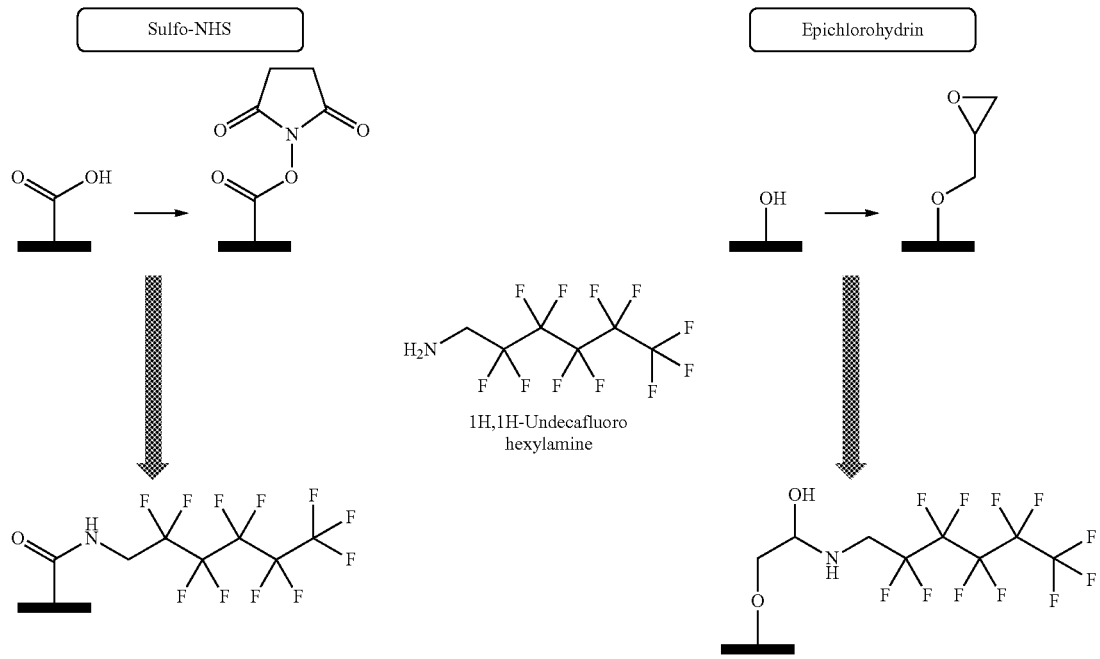

Scheme E3

Further, XPS measurement was performed on the nanodiamond after introduction of the fluoroalkylamino group in the present example. Table 7 below shows the XPS measurement results in the case where a fluoroalkylamino group was introduced using N-hydroxysulfosuccinimide. Table 8 below shows the XPS measurement results in the case where a fluoroalkylamino group was introduced using epichlorohydrin. As shown in Table 7 below, since each of the nanodiamonds before and after the oxidation reaction had a fluorine atom introduced after the reaction with 1H,1H-undecafluorohexylamine, it was suggested that a carboxy group was present on the surface. Note that, since more fluorine atoms were introduced into the nanodiamond after the oxidation reaction, it was suggested that the carboxy group was increased compared to before the oxidation reaction. Similarly, as shown in Table 8 below, since each of the nanodiamonds before and after the oxidation reaction had a fluorine atom introduced after the reaction with 1H,1H-undecafluorohexylamine, it was suggested that a hydroxy group was present on the surface. Note that, since more fluorine atoms were introduced into the nanodiamond after the oxidation reaction, it was suggested that the hydroxy group was increased compared to before the oxidation reaction.

TABLE 7

Fluoroalkylamino Group Introduction using N-Hydroxysulfosuccinimide

| Element ratio | C | O | F |
|---|---|---|---|
| Before oxidation reaction | 79.1 | 17.3 | 2.2 |
| 30 min after oxidation reaction | 75.5 | 19.2 | 4.0 |
| Change amount | −3.6 | +1.9 | +1.8 |

TABLE 8

Fluoroalkylamino Group Introduction using Epichlorohydrin

| Element ratio | C | O | F |
|---|---|---|---|
| Before oxidation reaction | 81.5 | 16.8 | 0.9 |
| 30 min after oxidation reaction | 76.8 | 18.1 | 3.4 |
| Change amount | −4.7 | +1.3 | +2.5 |

Example 4

The diamond-like carbon (DLC) film of the grid for cryo-electron microscopy was modified by surface-treating (oxidation reaction) in the following manner, and further reacted with N-hydroxysulfosuccinimide (Sulfo-NHS) or epichlorohydrin to introduce a functional group, thereby producing the grid for cryo-electron microscopy. In addition, the cryo-electron microscopy grid was used to capture proteins.

[Production of DLC-Carrying Grid]

A diamond-like carbon (DLC) thin film having a thickness of 10 nm was deposited on a mica plate by the PVD method according to a usual method. Thereafter, the DLC thin film was allowed to float on the water surface of a water tank in which QUANTIFOIL (trade name of a grid for cryo-electron microscopy, produced by Quantifoil Micro Tools GmbH) was placed at the bottom, and water was then gently drained, thereby producing a grid for cryo-electron microscopy on which QUANTIFOIL was coated with DLC (hereinafter, sometimes referred to as a "DLC-carrying grid"). This DLC-carrying grid was dried for 24 hours and used in the next step.

[Oxidation of DLC-Carrying Grid in Gas Phase]

The surface-treating (oxidation reaction) was performed and then dried under reduced pressure for 24 hours in the same manner as in FIG. 1 (Example 1), except that the DLC-carrying grid was used, as the carbon allotrope 6 of FIG. 1, instead of the carbon allotrope of Example 1 and the light irradiation was performed for 1, 3, or 10 minutes, thereby producing a grid for cryo-electron microscopy in which the DLC thin film surface of the DLC-carrying grid was oxidized (modified).

[Negative Stain Experiment Using Apoferritin and Electron Microscopy]

To the DLC-carrying grid before or after the surface-treating (oxidation reaction), as an aqueous solution for coupling reaction (coupling aqueous solution), a 1% by mass epichlorohydrin aqueous solution (2 μl) was added, or a 1% by mass EDC (1-(3-dimethylaminopropyl)-3-ethylcarbodiimide hydrochloride, a 1-(3-dimethylaminopropyl)-3-ethylcarbodiimide hydrochloride) aqueous solution and a 1% by mass N-hydroxysulfosuccinimide (Sulfo-NHS) aqueous solution were added, followed by standing at room temperature for 5 minutes. Thereafter, the coupling aqueous solution was removed using a filter paper. In this manner, a DLC-carrying grid treated with epichlorohydrin or Sulfo-NHS was obtained. Further, to this DLC-carrying grid, 1% by mass apoferritin aqueous solution (20 mM disodium hydrogen phosphate, 150 mM NaCl, pH 7.0) was added and allowed to stand for 10 minutes. Then, the resultant was washed with 2% by mass of an ammonium molybdate aqueous solution, and the aqueous solution was removed using a filter paper. Thereafter, measurement was performed by the Vitreous Ice Embedding method using a cryo-electron microscopy (Hitachi, Ltd., trade name: "H-7650", 80 kV, mag: 80000), and apoferritin captured by the DLC-carrying grid was observed.

FIGS. 10 to 14 show negative stain TEM images (photographs) taken by the cryo-electron microscopy.

Figure 10:
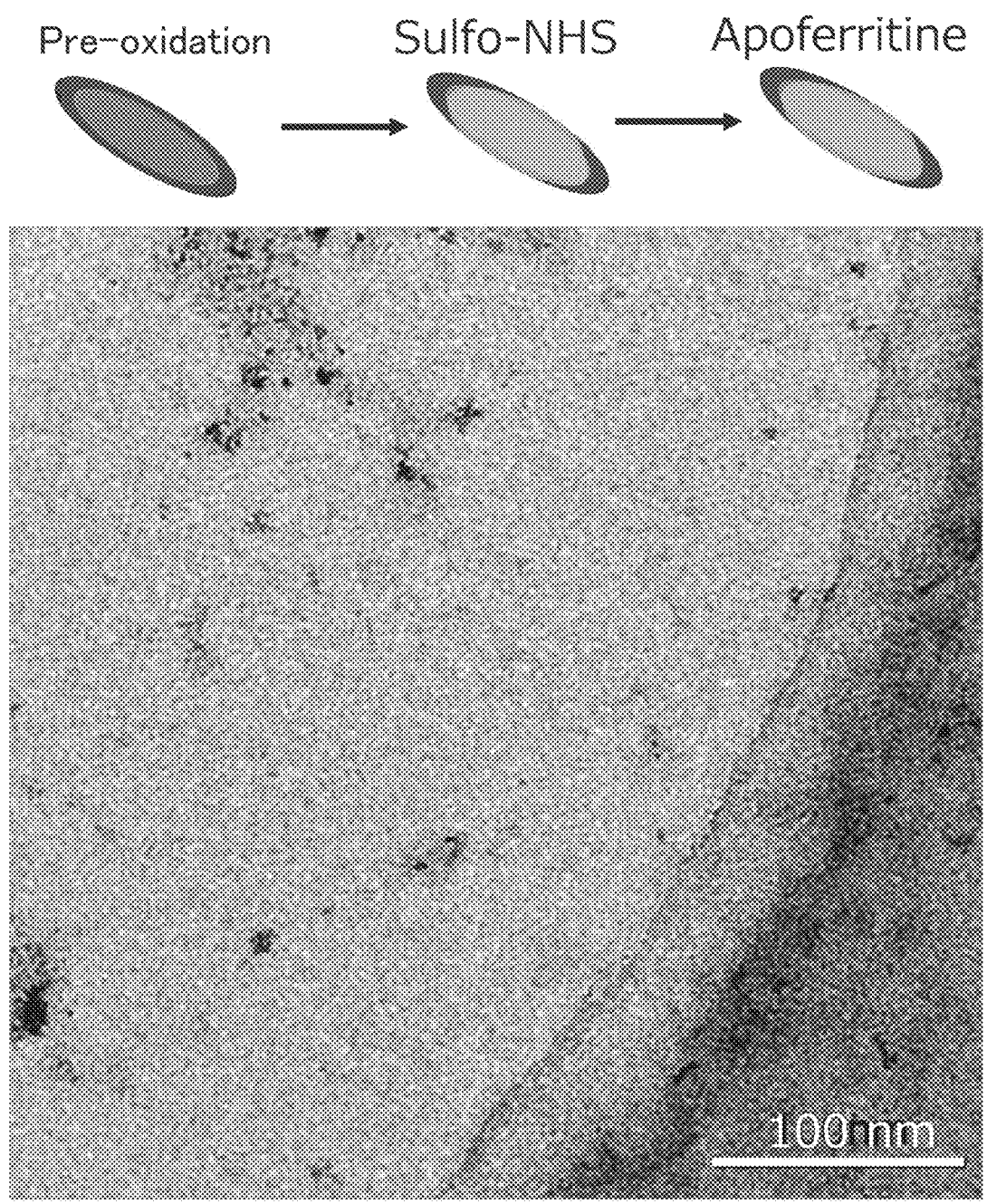
FIG. 10 is a negative stain TEM image obtained by treating an unoxidized (pre-oxidation reaction) DLC-carrying grid with Sulfo-NHS and further with apoferritin in Examples.

FIG. 10 is a negative stain TEM image obtained by treating an unoxidized (pre-oxidation reaction) DLC-carrying grid with Sulfo-NHS and further with apoferritin. As shown in FIG. 10, images of apoferritin were not observed, which showed that apoferritin sufficient for observation by the cryo-electron microscopy could not be captured by this DLC-carrying grid. This is considered to be due to the fact that the DLC-surface was not modified by oxidation, so that the functional group could not be introduced even when the DLC-surface was treated with Sulfo-NHS.

Figure 11:
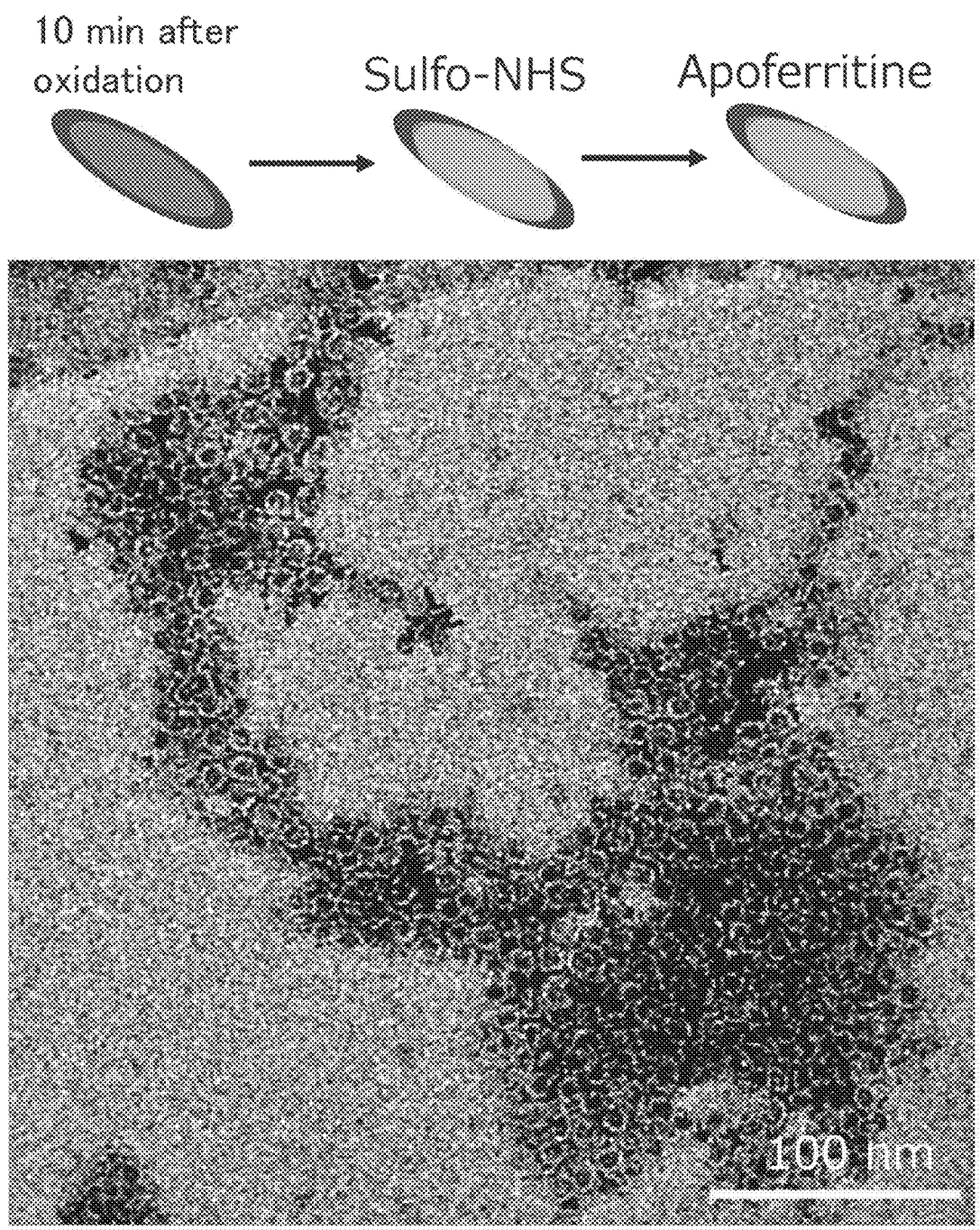
FIG. 11 is a negative stain TEM image obtained by treating a DLC-carrying grid after 10 minutes of surface-treating (oxidation reaction) with Sulfo-NHS and further with apoferritin in Examples.

FIG. 11 is a negative stain TEM image obtained by treating the DLC-carrying grid 10 minutes after the surface-treating (oxidation reaction) with Sulfo-NHS and further with apoferritin. As shown in FIG. 11, images of apoferritin were observed with this DLC-carrying grid. This is considered to be due to the fact that the DLC surface was modified by the oxidation reaction in the surface-treating, so that the functional group was introduced by the treatment with Sulfo-NHS, and the functional group was bonded to apoferritin. In addition, uneven distribution and uneven orientation of apoferritin were not observed. That is, this DLC-carrying grid can suppress or prevent uneven distribution, uneven orientation, and the like of apoferritin (protein), which is a structural analysis target substance.

Figure 12:
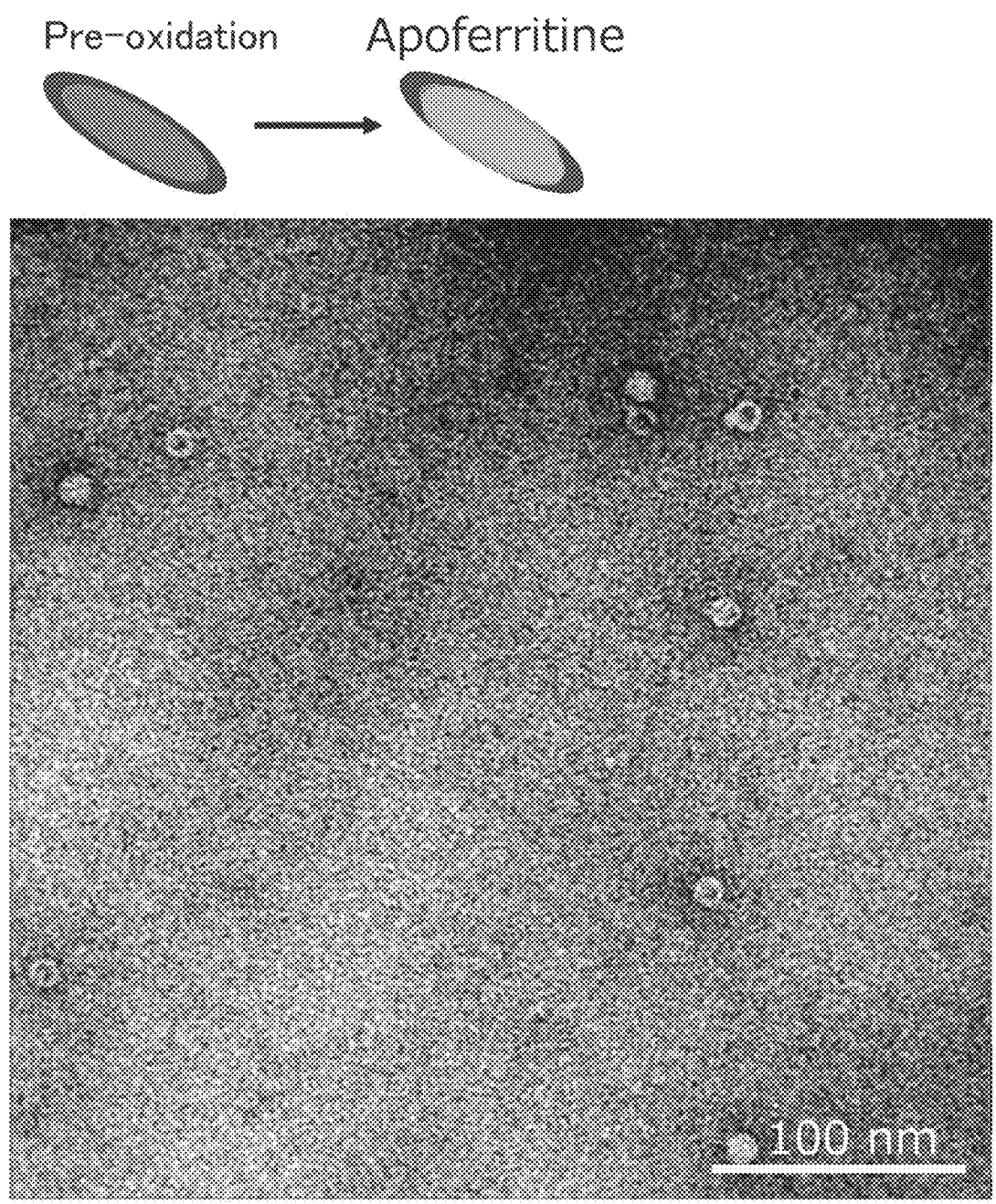
FIG. 12 is a negative stain TEM image obtained by directly treating an unoxidized (pre-oxidation reaction) DLC-carrying grid with apoferritin without treating with epichlorohydrin or Sulfo-NHS in Examples.

FIG. 12 is a negative stain TEM image obtained by directly treating the unoxidized (pre-oxidation reaction) DLC-carrying grid with apoferritin without treating with epichlorohydrin or Sulfo-NHS. As shown in FIG. 12, images of apoferritin were not observed, which showed that apoferritin sufficient for observation by the cryo-electron microscopy could not be captured by this DLC-carrying grid.

Figure 13:
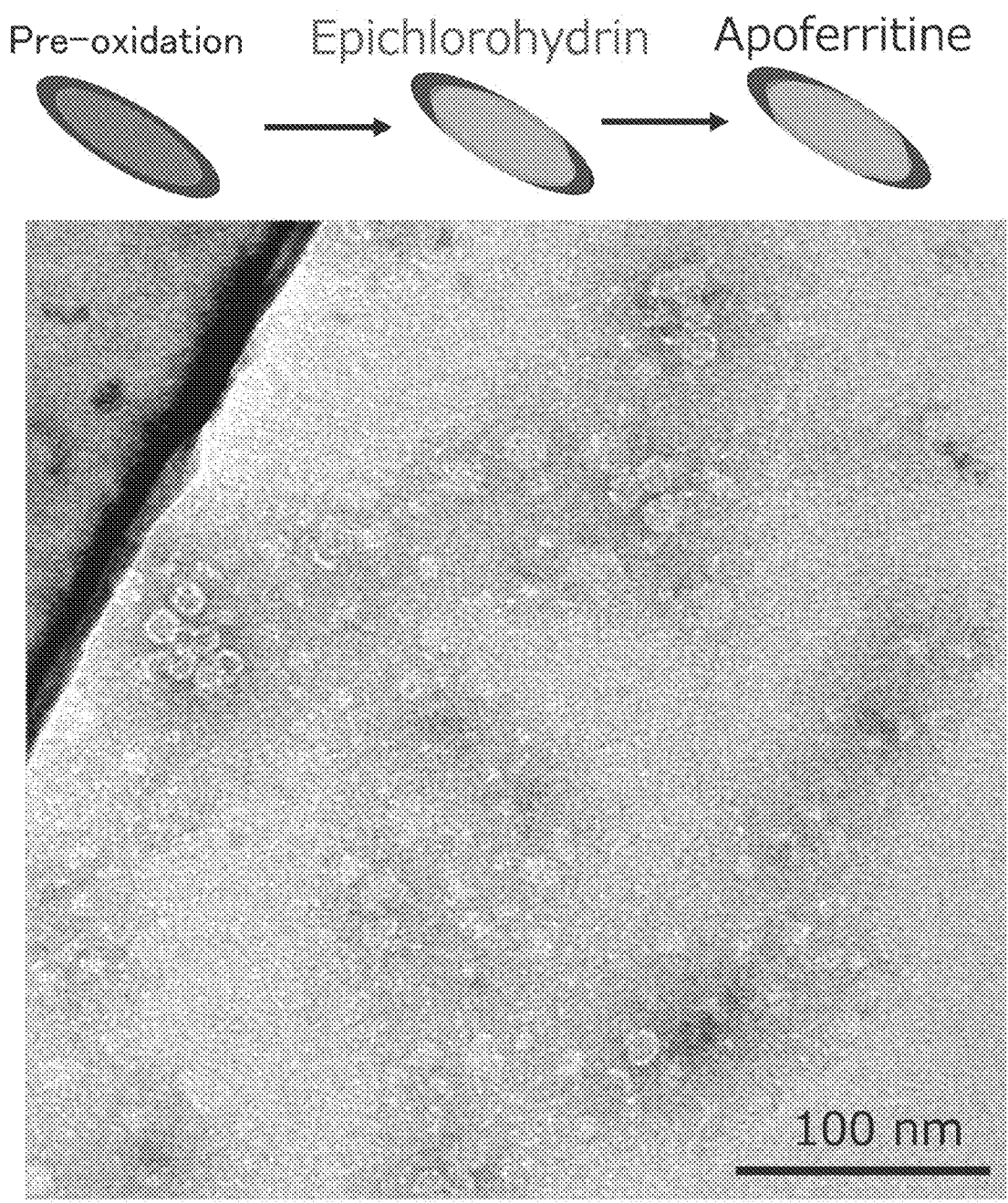
FIG. 13 is a negative stain TEM image obtained by treating an unoxidized (pre-oxidation reaction) DLC-carrying grid with epichlorohydrin and further with apoferritin in Examples.

FIG. 13 is a negative stain TEM image obtained by treating the unoxidized (pre-oxidation reaction) DLC-carrying grid with epichlorohydrin and further with apoferritin. As shown in FIG. 13, images of apoferritin were slightly observed with this DLC-carrying grid. This is presumed to be because, even if the DLC surface was not modified by oxidation, the DLC surface slightly has a hydroxy group, and a functional group was introduced by the treatment with epichlorohydrin. In addition, uneven distribution and uneven orientation of apoferritin were not observed. That is, this DLC-carrying grid can suppress or prevent uneven distribution, uneven orientation, and the like of apoferritin (protein), which is a structural analysis target substance.

Figure 14:
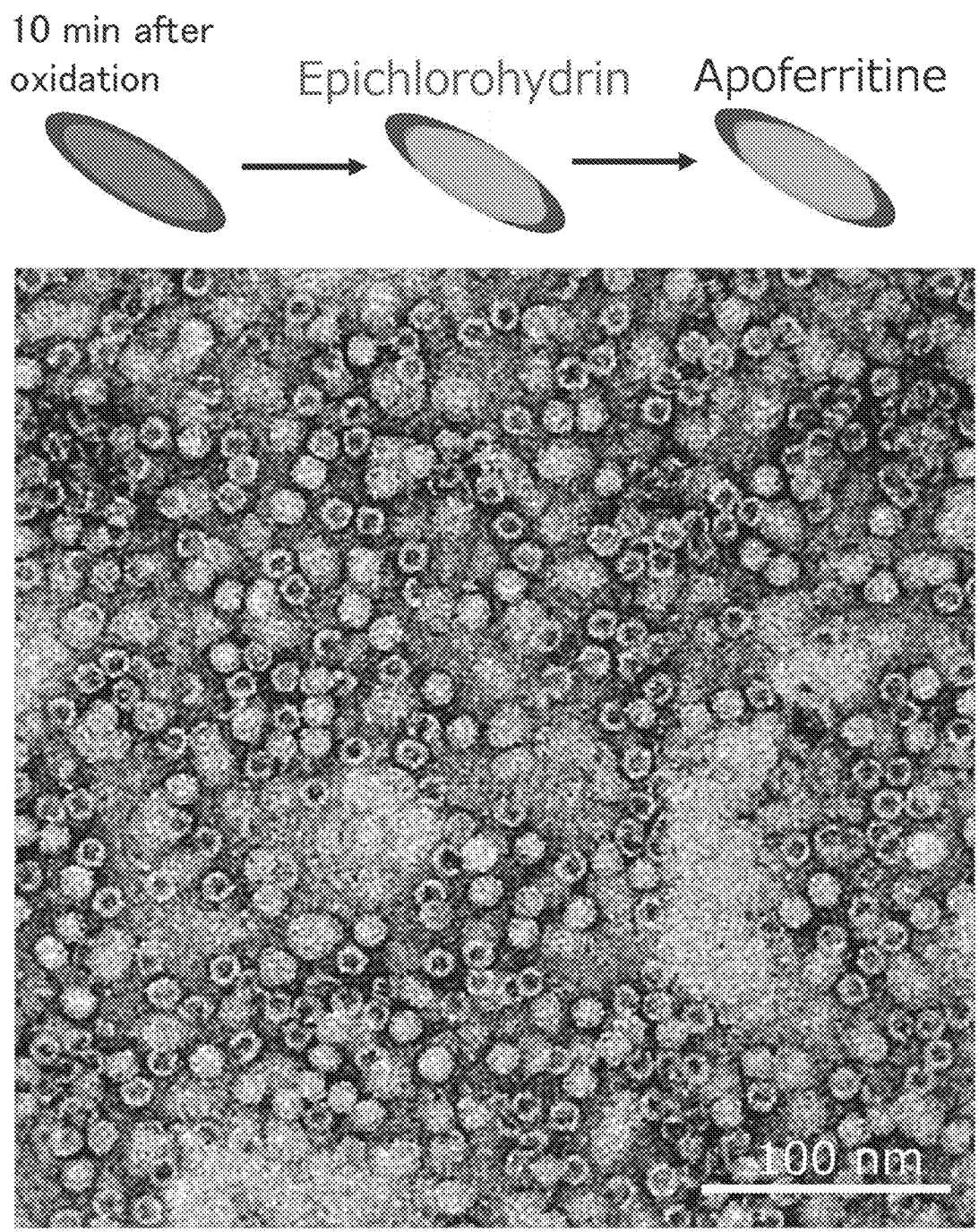
FIG. 14 is a negative stain TEM image obtained by treating a DLC-carrying grid 10 minutes after surface-treating (oxidation reaction) with epichlorohydrin and further with apoferritin in Examples.

FIG. 14 is a negative stain TEM image obtained by treating the DLC-carrying grid 10 minutes after the surface-treating (oxidation reaction) with epichlorohydrin and further with apoferritin. As shown FIG. 14, images of apoferritin that were evenly distributed (not unevenly distributed) throughout the screen were observed with this DLC-carrying grid. In addition, uneven distribution and uneven orientation of apoferritin were not observed. That is, this DLC-carrying grid can suppress or prevent uneven distribution, uneven orientation, and the like of apoferritin (protein), which is a structural analysis target substance.

Example 5

A graphene grid was produced, and the surface of the produced graphene grid was modified (oxidized) by performing the surface-treating with a chlorine dioxide radical. Then, the functional group-introducing of introducing a functional group into the modified (oxidized) graphene grid surface to produce a graphene grid into which a functional group was introduced. In addition, a protein, which is a structural analysis target substance by cryo-electron microscopy, was conjugated (bonded) to the graphene grid into which the functional group was introduced.

[Production of Graphene Grid]

A sheet composed of three layers of polymethyl methacrylate (PMMA)-graphene-Cu was allowed to float such that the Cu surface was brought into contact with the water surface of a 0.5 mol/l ammonium persulfate aqueous solution, and the Cu layer was dissolved by standing still for 30 minutes. The PMMA-graphene sheet thus obtained by removing the Cu layer was allowed to float and washed in an ultrapure water for a total of two times for 10 minutes. Thereafter, a Mo grid (produced by Quantifoil Micro Tools GmbH, trade name: QUANTIFOIL) and an Au grid (produced by Quantifoil Micro Tools GmbH, trade name: QUANTIFOIL) for TEM were placed at the bottom of a film tensioner (produced by Okenshoji Co., Ltd., trade name: Collision film tensioner) filled with ultrapure water. Further, by floating the PMMA-graphene sheet on the water surface of the film tensioner and gently draining the water, PMMA-graphene sheet was adhered to the grid. The grid was dried for 1 hour at room temperature, and heat treatment was performed for 20 minutes at 130° C. Thereafter, the grid was immersed in acetone at 60° C. for 60 minutes, chloroform at room temperature (about 25° C.) for 30 minutes, acetic acid for 3 hours, and isopropyl alcohol for 10 minutes in a total of twice to remove PMMA. Finally, heat treatment was performed at 100° C. for 10 minutes to produce a graphene grid with a Mo grid or Au grid surface coated with graphene.

[Reaction Between Graphene Grid and Chlorine Dioxide Radical (Surface-Treating)]

Each of the graphene grids produced from the Mo grid and Au grid was subjected to heat treatment at 130° C. for 15 minutes. After the heat treatment, the graphene grid was subjected to surface-treating (surface oxidation) by a chlorine dioxide radical (ClO$_2$ radical) in the same manner as described in Example 1 and FIG. 1. In the present embodiment, however, the graphene grid was covered with aluminum foil and the surface-treating (surface oxidation) was performed so that the LED light (UV light) did not directly hit the graphene grid. The reaction time (light irradiation time) was set to 10 minutes, and the reaction temperature was set to room temperature as in Example 1. The XPS measurement was performed on the graphene grids before and after the surface-treating in the same manner as in Example 1. As a result, the decrease of the C=C bond peak, and the increase of the C—OH bond peak and the increase of C—O—C bond peak were observed after the surface-treating, and further, the ratio of the number of 0 atoms was increased, which verified the oxidation of the graphene surface.

(6) Functional Group-Introducing

A functional group was introduced into the graphene grid surface after the surface-treating (functional group-introducing) according to Scheme 1 below,

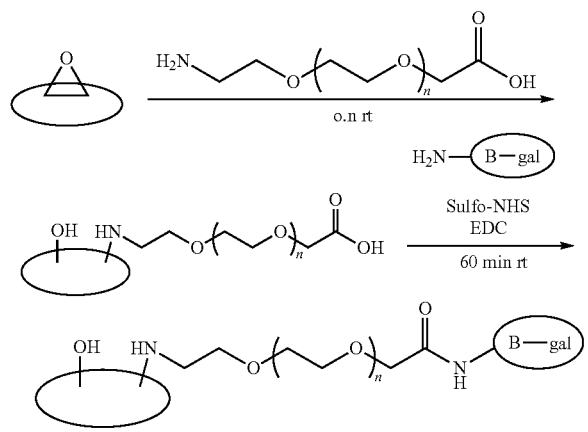

Scheme 1

Specifically, the functional group-introducing was performed as follows. First, the graphene grid after the surface-treating was immersed in 2 mmol/l polyethylene glycol 2-aminoethyletheracetic acid, poly(ethylene glycol) 2-aminoethyl ether acetic acid (average molecular weight: 2100) DMSO solution, and allowed to stand overnight at room temperature. Thus, as shown in Scheme 1, a functional group was introduced by reacting an epoxide on the graphene grid surface with the polyethylene glycol 2-aminoethylether acetic acid.

Further, a protein, which is a structural analysis target substance by cryo-electron microscopy, was conjugated (bonded) to the graphene grid subjected to the functional group-introducing. Specifically, the graphene grid was immersed in an aqueous solution containing 5 mmol/l N-hydroxysulfosuccinimide (Sulfo-NHS) and 5 mmol/l EDC for 15 minutes, followed by immersion in an aqueous solution containing 0.2 mg/ml β-galactosidase (B-gal) for 60 minutes to bond by reacting with an amino group present in β-galactosidase (B-gal) as shown in Scheme 1.

Example 6

An amorphous carbon grid was produced and the thus produced amorphous carbon grid was subjected to the surface-treating to react its amorphous carbon grid with a chlorine dioxide radical to modify (oxidize) the surface, thereby producing an amorphous carbon grid with a modified (oxidized) surface. Further, the functional group-introducing of introducing a functional group into the modified (oxidized) surface of the amorphous carbon grid was performed to produce an amorphous carbon grid into which a functional group was introduced. In addition, a protein, which is a structural analysis target substance by cryo-electron microscopy, was conjugated (bonded) to the amorphous carbon grid into which the functional group was introduced.

[Production of Amorphous Carbon Grid]

A Mo grid (produced by Quantifoil Micro Tools GmbH, trade name: QUANTIFOIL) and an Au grid (produced by Quantifoil Micro Tools GmbH, trade name: QUANTIFOIL) for TEM were placed at the bottom of a film tensioner (produced by Okenshoji Co., Ltd., trade name: Collision film tensioner) filled with ultrapure water. The carbon film grown on the mica plate was gently put into the water, so that only the carbon film was peeled off on the water surface, and the water was gently removed, whereby the amorphous carbon film was attached on the grid. The grid was allowed to dry overnight at room temperature to produce an amorphous carbon grid on which the Mo grid or Au grid surface is coated with amorphous carbon.

[Reaction Between Amorphous Carbon Grid and Chlorine Dioxide Radical (Surface-Treating)]

The surface-treating (surface oxidation) with a chlorine dioxide radical (ClO$_2$ radical) was performed in the same manner as in Example 5, except that the amorphous carbon grid produced from the Mo grid or Au grid was used instead of the graphene grid of Example 5, and the reaction time (light irradiation time) was set to 5 minutes. The XPS measurement was performed on the amorphous carbon grids before and after the surface-treating in the same manner as in Example 1. As a result, the decrease of the C=C bond peak, and the increase of the C—OH bond peak and the increase of the C—O—C bond peak were observed after the surface-treating, and further, the ratio of the number of O atoms was increased, which verified the oxidation of the amorphous carbon surface.

[Functional Group-Introducing]

A functional group was introduced into the amorphous carbon grid surface after the surface-treating (functional group-introducing) according to Scheme 2 below.

Scheme 2

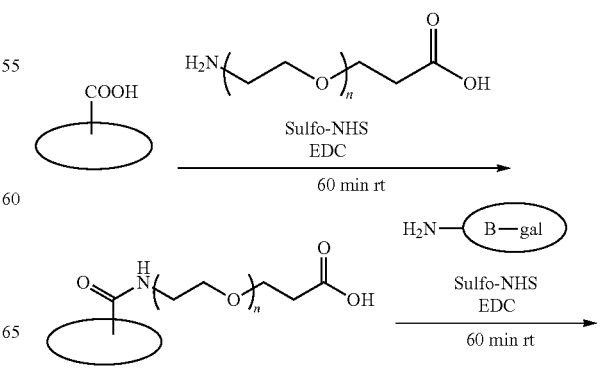

-continued

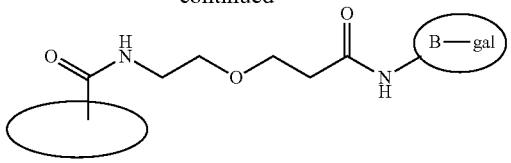

Specifically, the functional group-introducing was performed as follows. First, the amorphous carbon grid after the surface-treating was heat-treated at 200° C. for 10 minutes, and then immersed in an aqueous solution containing 10 mmol/l of N-hydroxysulfosuccinimide (Sulfo-NHS) and 10 mmol/l of EDCs, and allowed to stand at room temperature for 10 minutes. Thereafter, the resultant was immersed in an aqueous solution containing 10 mmol/l $NH_2$-PEG8-propionic acid and allowed to stand at room temperature for 60 minutes. Thus, as shown in Scheme 2, a functional group was introduced by reacting the carboxyl group on the amorphous carbon grid surface with a $NH_2$-PEG-propionic acid.

Further, a protein, which is a structural analysis target substance by cryo-electron microscopy, was conjugated (bonded) to the amorphous carbon grid to which the β-galactosidase (B-gal) was bonded. Specifically, the amorphous carbon grid was immersed in an aqueous solution containing 10 mmol/l N-hydroxysulfosuccinimide (Sulfo-NHS) and 10 mmol/l EDC for 10 minutes, followed by immersion in an aqueous solution containing 0.2 mg/ml β-galactosidase (B-gal) for 60 minutes to bond by reacting with an amino group present in β-galactosidase (B-gal) as shown in Scheme 2.

While the present invention has been described above with reference to illustrative embodiments, the present invention is by no means limited thereto. Various changes and variations that may become apparent to those skilled in the art may be made in the configuration and specifics of the present invention without departing from the scope of the present invention.

INDUSTRIAL APPLICABILITY

As described above, according to the present invention, it is possible to provide a method for producing a substance with a modified carbon allotrope surface, a method for producing a substance with a carbon allotrope surface into which a functional group is introduced, a method for producing a grid for cryo-electron microscopy, an organic substance, and a grid for cryo-electron microscopy that can suppress or prevent uneven distribution, uneven orientation, and the like of a structural analysis target substance in a structural analysis by cryo-electron microscopy. Also, the application of the present invention is not limited to cryo-electron microscopy, and can be used in a wide range of applications, and its industrial application value is large.

This application claims priority from Japanese Patent Application No. 2019-061938 filed on Mar. 27, 2019. The entire subject matter of the Japanese Patent Applications is incorporated herein by reference.

REFERENCE SIGNS LIST

1: petri dish
2: lid
3: petri dish
4: petri dish
5: radical generation reaction system
6: carbon allotrope
11: organic layer (organic phase)
12: aqueous layer (aqueous phase)

The invention claimed is:

1. A method for producing a substance with a modified carbon allotrope surface, comprising: the step of
    surface-treating by reacting a carbon allotrope surface with a halogen oxide radical, wherein
    the carbon allotrope surface is modified by the surface-treating.
2. The method according to claim 1, wherein
    the carbon allotrope is diamond-like carbon (DLC), graphene, carbon nanotube, fullerene, nanodiamond, graphite, diamond, carbon nanohorn, or carbon fiber.
3. The method according to claim 1, wherein
    the carbon allotrope surface is oxidized by the surface-treating, and
    the substance with a modified carbon allotrope surface is a substance with an oxidized carbon allotrope surface.
4. The method according to claim 1, wherein
    a reaction system is not irradiated with light by the surface-treating.
5. The method according to claim 4, wherein
    the reaction system in the surface-treating is a gas reaction system or a liquid reaction system.
6. The method according to claim 1, wherein
    the halogen oxide radical is a chlorine dioxide radical.
7. A method for producing a substance with a carbon allotrope surface into which a functional group is introduced, comprising the steps of:
    producing a substance with a modified carbon allotrope surface by the method according to claim 1; and
    introducing a functional group into the modified surface.
8. The method according to claim 7, wherein
    the functional group is at least one selected from the group consisting of a hydroxy group, a carboxy group, an aldehyde group, a carbonyl group, an ether bond, and an ester bond.
9. A method for producing a grid for cryo-electron microscopy formed of a substance with a carbon allotrope surface into which a functional group is introduced, comprising the step of:
    producing a substance with a carbon allotrope surface into which a functional group is introduced by the method according to claim 7.

* * * * *